United States Patent
V et al.

(10) Patent No.: US 11,761,995 B2
(45) Date of Patent: Sep. 19, 2023

(54) TEST SYSTEM FOR AN INTELLIGENT ELECTRONIC DEVICE IN AN ELECTRIC SUB-STATION

(71) Applicant: Hitachi Energy Switzerland AG, Baden (CH)

(72) Inventors: Loganadhan V, Bengaluru (IN); Mahesh Ramachandra, Karnataka (IN); Manjunath Aj, Bengaluru (IN); Shambhulingappa S, Karnataka (IN)

(73) Assignee: Hitachi Energy Switzerland AG, Baden (CH)

( * ) Notice: Subject to any disclaimer, the term of this patent is extended or adjusted under 35 U.S.C. 154(b) by 133 days.

(21) Appl. No.: 17/607,608

(22) PCT Filed: Apr. 29, 2020

(86) PCT No.: PCT/EP2020/061957
§ 371 (c)(1),
(2) Date: Oct. 29, 2021

(87) PCT Pub. No.: WO2020/221830
PCT Pub. Date: Nov. 5, 2020

(65) Prior Publication Data
US 2022/0221495 A1 Jul. 14, 2022

(30) Foreign Application Priority Data

Apr. 29, 2019 (IN) .............................. 201941016950
Aug. 7, 2019 (EP) ..................................... 19190551

(51) Int. Cl.
*G01R 19/25* (2006.01)
*G01R 1/20* (2006.01)
*G01R 35/00* (2006.01)

(52) U.S. Cl.
CPC ........... *G01R 19/2513* (2013.01); *G01R 1/20* (2013.01); *G01R 35/00* (2013.01)

(58) Field of Classification Search
CPC ....... G01R 19/2513; G01R 1/20; G01R 35/00
USPC ......................................... 324/515, 511, 500
See application file for complete search history.

(56) References Cited

U.S. PATENT DOCUMENTS

| | | |
|---|---|---|
| 9,110,102 B2 | 8/2015 | Kesler |
| 2011/0056819 A1 | 3/2011 | Bower et al. |
| 2014/0253146 A1 | 9/2014 | Kesler |
| 2020/0112160 A1* | 4/2020 | Wenke ............... G01R 19/2513 |

(Continued)

FOREIGN PATENT DOCUMENTS

WO 2016/161522 A1 10/2016

OTHER PUBLICATIONS

International Search Report and Written Opinion of the International Searching Authority for related PCT application Mo. PCT/EP2020/061957 dated Jul. 23, 2020, 16 pages.

*Primary Examiner* — Giovanni Astacio-Oquendo
(74) *Attorney, Agent, or Firm* — PROCOPIO, CORY, HARGREAVES & SAVITCH

(57) ABSTRACT

Test system for an intelligent electronic device in an electric sub-station. Examples of a test switch unit are described. Each test switch unit may be utilized for opening of the trip circuit, the shorting of the CT and subsequently isolation of the VT circuits, respectively. Once the trip circuits have been opened, and the CT/VT circuits have been shorted and isolated, respectively, the IED may be tested by providing the appropriate test signals.

20 Claims, 17 Drawing Sheets

(56) References Cited

U.S. PATENT DOCUMENTS

2021/0109136 A1* 4/2021 Hao ................... G01R 19/0092
2021/0364557 A1* 11/2021 Schweitzer, III . H02J 13/00002

* cited by examiner

TEST SYSTEM FOR AN INTELLIGENT ELECTRONIC DEVICE IN AN ELECTRIC SUB-STATION

CROSS-REFERENCE TO RELATED APPLICATIONS

The present application is a national stage entry of International Patent App. No. PCT/EP2020/061957, filed on Apr. 29, 2020, which claims priority to Indian Patent App. No. 201941016950, filed on Apr. 29, 2019 and European Patent App. No. 19190551.2, filed on Aug. 7, 2019, which are hereby incorporated herein by reference as if set forth in full.

TECHNICAL FIELD

The present subject matter relates, in general, to test systems for intelligent electronic devices, and in particular, to test switches of such tests systems.

BACKGROUND

Electrical power generation and distribution systems include a number of components and electrical circuitry. Such components and circuitry may be generally controlled through Intelligent Electronic Devices (referred to as IEDs). In operation, such components and circuits are coupled to one or more sensors. The sensors may detect the appropriate operational parameters which may be communicated to the IED. The IED, on receiving the information from sensors may generate a number of control signals for controlling the components and the electrical circuitry. The IEDs may be periodically tested during which the IEDs may be isolated from the main current paths of the electrical power generation and distribution systems using appropriate test devices. The current modular test switch assemblies such as US 2011/0056819 A1, US 2014/0253146 A1 and WO2016/161522A1 disclose a switch for each test unit which may increase the human error in usage procedure.

BRIEF DESCRIPTION OF DRAWINGS

The features, aspects, and advantages of the present subject matter will be better understood with regard to the following description and accompanying figures. The use of the same reference number in different figures indicate similar or identical features and components.

DETAILED DESCRIPTION

Figure 1:
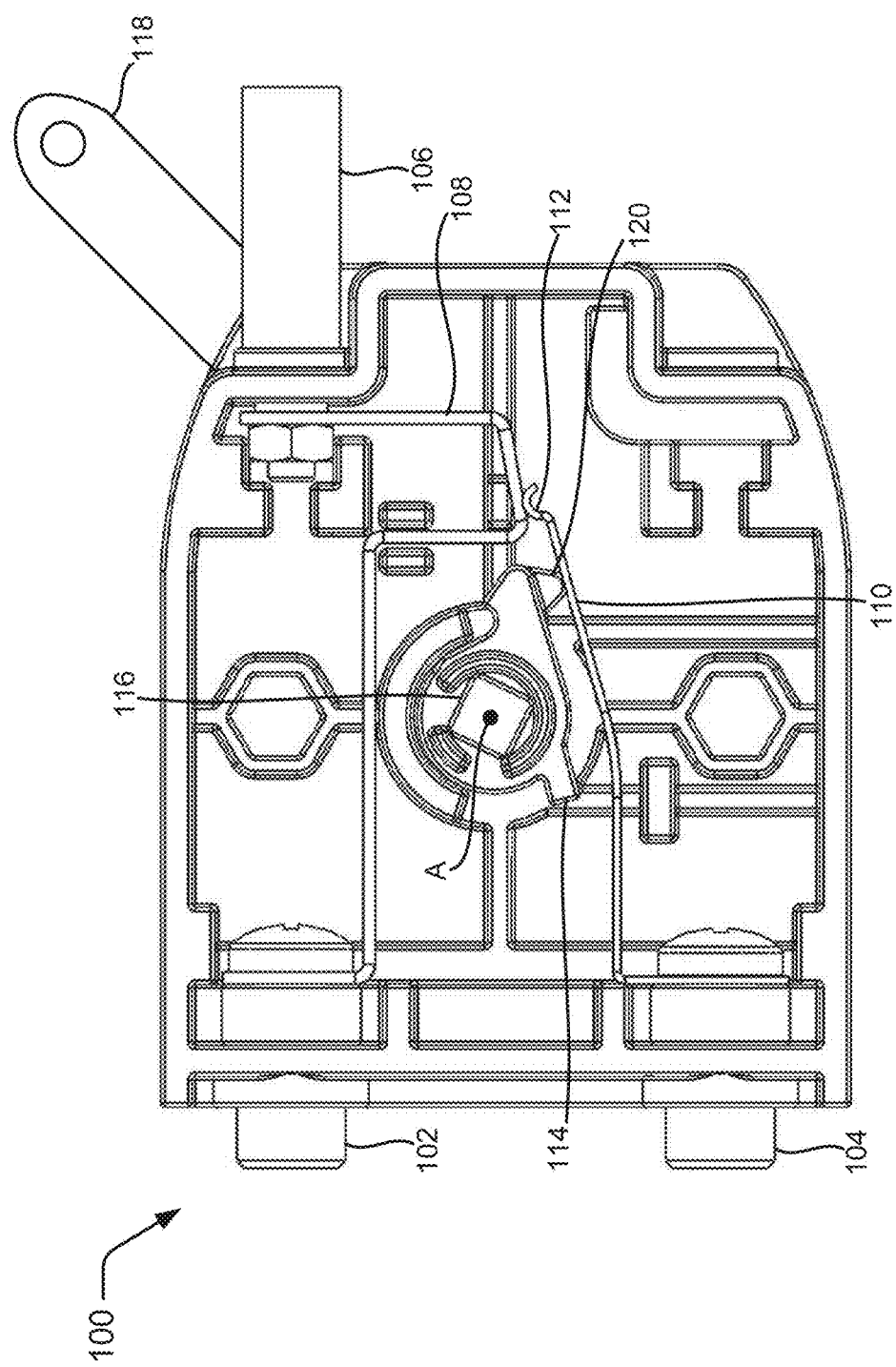
FIGS. 1-2 illustrates a cross-sectional view of a test switch unit in various stages of operation, in accordance with one implementation of the present subject matter.

Electrical power generation and distribution systems are adapted to generate, transmit, and distribute electrical energy to loads. Such systems may further include electrical substations that may include equipment, such as electrical generators, power transformers, power transmission/distribution lines, circuit breakers, and voltage regulators. Such equipment may be protected, monitored, and controlled through intelligent electronic devices or IEDs. Through various sensors, the IED may receive operational information pertaining to the various components, in response to which the IED may generate one or more control signals for controlling the operation of such equipment.

Of the components mentioned above, the IED may also be coupled to trip circuits, current transformer (CT) circuits, and voltage transformer (VT) circuits. As is generally understood, trip circuits respond to overload conditions by opening the circuit in through which electrical power is passed. Further, both the CT circuit and the VT circuits transform the electrical current to levels which can be then utilized or measured.

The IEDs may be routinely subject to maintenance, or in certain cases may have to be repaired. The testing and maintenance of the IEDs is implemented through test switch units. The test switch units, generally, may be coupled to the IED which is to be tested. Before testing commences, the testing switches may isolate the IED and the trip, CT and the VT circuits. Once the relevant circuits and the IED are isolated, the test switch unit may provide the IED with one or more test inputs for testing the functioning of the IED. The IED may generate certain responses corresponding to the test inputs, which may then be assessed for determining whether the IED is operating in the desired manner.

Generally, multiple test switches are utilized as part of a test system. In certain cases, the test systems may be composed of disparate and separate parts which may have to be used for performing the testing operations. For example, such conventional test systems may include a main unit (which is coupled to the IED) in which an insertable unit may be inserted. The insertable unit may then either open or isolate the appropriate circuits in order to isolate the IED for testing. However, in such test switch units, the main unit and the insertable unit are separate components that are both required for testing the intelligent electronic device. For using the test system, test personnel may have to manually insert and adjust the plugs of the insertable unit into the contacts of the main unit. In cases where multiple IEDs are to be tested, the insertable unit has to be serially removed from one main unit and inserted into the main unit of the other IED which is to be tested. The continuous insertion and removal of the insertable unit entails tremendous manual efforts.

Furthermore, the insertable unit while being inserted may also have to be properly aligned with each contact of the main unit, since improper alignment may lead to a loose connection and therefore may not result in a proper isolation of the IED for testing. In certain cases, where the main unit is positioned at a height, further efforts may have to be made by the testing personnel for properly aligning and securing the insertable unit inside the main unit.

Approaches and example of a test switch unit for a test system are described. In one example, the test systems as described are a singular unit. To that end, at least the test systems may be installed and operated using less efforts. Furthermore, since no separate insertable unit is present, the issues pertaining to alignment and loose connection also are avoided. The test systems as described include one or more test switches which may be used for testing the IED. In one example, a test switch unit for a test system for an intelligent electronic device may include a relay lead and a field lead. In one example, the test switch unit may be either for a trip circuit or for a CT/VT circuit. In either case, the test switch unit may further include at least one contact element. The relay lead is any terminal which may be electrically connected with the IED. On the other hand, the field lead is the terminal which is to receive the input current. The contact element enables, in one example, opening of the trip circuit. In another example, for a CT circuit, the test switch unit may include at least two contact elements. In such cases, the contact element may enable isolation of the CT circuit coupled to the IED, so that the IED under consideration may be tested.

The test switch unit may further include a rotatable cam. The cam is provided with one or more profiled elements, such as a cam lobe, provided at its circumference. It may be noted that the profiled elements may be considered as any structural protrusion or protrusions provided on the circumference of the cam. Such elements during operations engages with the contact elements upon rotation of the cam, which pushes the contact elements in a downward direction away from the cam. The rotation of the cam, in one example, may be affected manually through the action of a lever coupled to a shaft on which the cam is mounted. Manually moving the lever affects the rotation of the shaft and in turn, the rotation of the cam. As the cam rotates, the profiled element provided on the cam also moves and engages with the one or more contact elements to move from its initial position. As the contact elements move, one of the opening of the trip circuit, the shorting of the CT and subsequently isolation of the VT circuits may occur, depending on whether the test switch unit being used is for a trip circuit or for the CT/VT circuits. Once the trip circuits have been opened, and the CT/VT circuits have been shorted and isolated, respectively, the IED may be tested by providing the appropriate test signals. In one example, the test switch unit coupled to a trip circuit comprises a trip contact element. In another example, the test switch unit coupled to one of the CT/VT circuits includes a primary contact element and a secondary contact element.

Approaches and example of a method for operating a test system are described. In one example, the test system may include a first test switch unit, a second test switch unit, and a third test switch unit. A lever may be engaged to rotate a cam about its axis (A). The lever is coupled to the cam. Upon rotation, the cam opens a trip circuit coupled to the first test switch unit when the cam engages with a trip contact element of the first test switch unit. Upon further rotation, the cam shorts a CT circuit coupled to the second test switch unit. In one example, the cam may include a leading profiled element and a secondary profiled element. The leading profiled element engages with a secondary contact element of the second test switch unit and the trailing profiled element engages with a primary contact element of the second test switch unit. Upon further rotation, the cam isolates a VT circuit coupled to the third test switch unit when the cam engages with a VT contact element of the third test switch unit.

The approaches described eliminates the need for a test handle as a separate component and overcomes any issues that may arise from locating such a test handle for the purposes of testing. The installation of the test switch unit is also easier to install and does not require to be skillfully guided into the appropriate and desired slots. As is described in the following paragraphs, the test switch unit provides for an efficient mechanism for isolating various types of circuits with minimal efforts. Furthermore, the test switch units as described are also less complex, and hence, would be cost effective and economical.

The operation of the test switch units is further described in conjunction with the accompanying figures. Wherever possible, the same reference numbers are used in the drawings and the following description to refer to the same or similar parts.

FIG. 1 illustrates a cross-sectional view of a test switch unit 100, as per one example of the present subject matter. Units such as the test switch unit 100 may be further installed in a test system, wherein such test system may be utilized for testing intelligent electronic devices (IEDs) installed within power generation and distribution systems. As noted above, the present illustration depicts the test switch unit 100 in one example. Other examples may also be possible without deviating from the scope of the subject matter of the claims.

Returning to FIG. 1, the test switch unit 100 includes a rectangular shaped enclosure in which various components may be present. In one example, the test switch unit 100 includes a relay lead 102 and the field lead 104. The relay lead 102 is adapted such that it may be coupled to the intelligent electronic device and the corresponding trip circuit. As would be generally understood, trip circuits may include circuit breakers that open the circuit in situations where there may be certain overload conditions, such as thermal overload, short-circuit, and a ground fault. The field lead 104 on the other hand is adapted to be coupled to a field supply current. The test switch unit 100 may further include a test signal lead 106. The test signal lead 106 is electrically coupled to the relay lead 102 through a conducting element 108. The conducting element 108 may be in the form of a wired connector or may be a solid metallic plate, which provides electric coupling between the relay lead 102 and the test signal lead 106.

Coupled to the field lead 104, the test switch unit 100 also includes a trip contact element 110. The trip contact element 110 may be manufactured from an electrically conducting and flexible material. One end of the trip contact element 110 is fixed with the field lead 104. Owing to the flexible material of the trip contact element 110, the other end of the trip contact element 110, i.e., the end 112 is moveable. In the present example, the end 112 of the trip contact element 110 abuts against the conducting element 108. In normal operation, the test signal lead 106 is not utilized and is open, the trip contact element 110 provides an electrically conducting path for the field supply current from the field lead 104 to the trip circuits which may be coupled to the relay lead 102.

The test switch unit 100 may further include a cam 114 mounted on a shaft 116. The shaft 116 is further coupled to a lever 118. The lever 118 is adapted to move in a notional plane which is perpendicular to an axis A about which the cam 114 is adapted to rotate. The cam 114 is provided with a profiled element 120 which also moves in a circular path, as the cam 114 rotates. In one example, the lever 118 may be actuated manually or may be coupled, either directly or indirectly, through mechanically driven means. In case of the latter, such mechanically driven means may be actuated based on one or more control signals.

As described previously, the relay lead 102 may be coupled to an IED and a trip circuit. The testing of the IED would involve the test signal lead 106 to be used for providing one or more test signals. Since the conducting element 108 provides an electrically conducting path for the field supply current between the field lead 104 (to which the and the relay lead 102, utilizing the test signal lead 106 during normal operation may result in the field supply current to pass through the test signal lead 106 as well. To this end, the trip circuit is opened so that no field supply current passes through the lever 118 using the test switch unit 100. The manner in which the test switch unit 100 operates is further described in conjunction with FIG. 2

Figure 2:
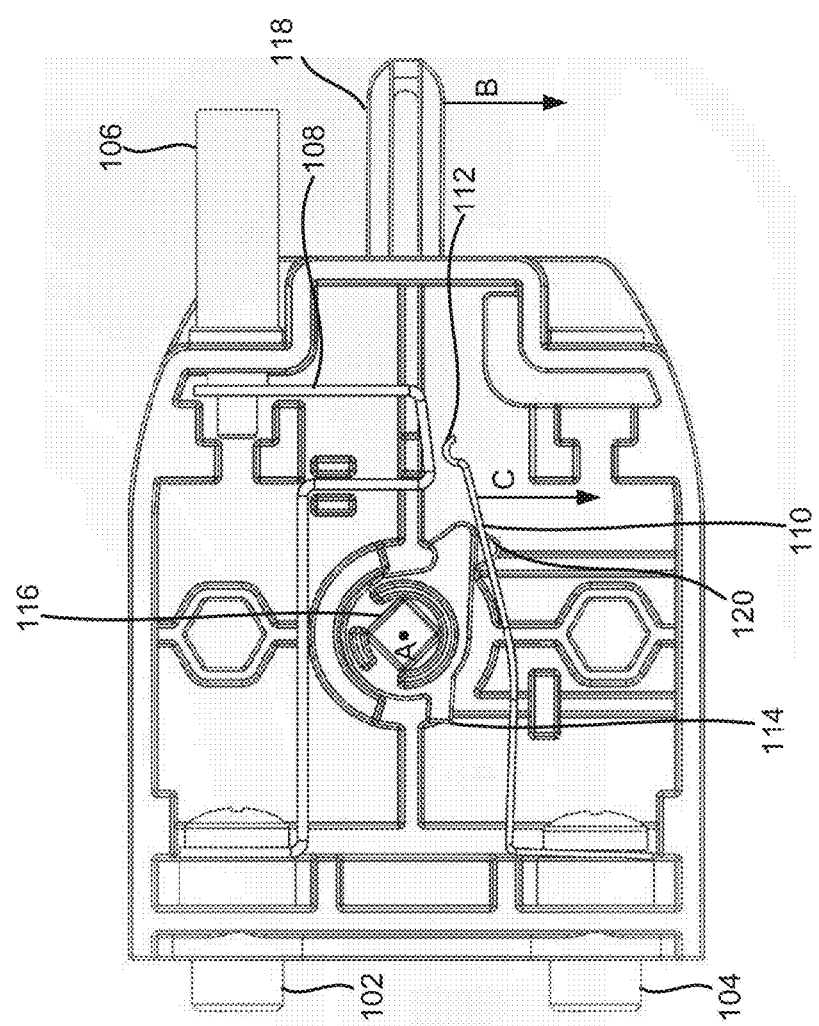

FIG. 2 illustrates a cross-sectional view of the test switch unit 100 in different stages of its working. As described previously, test switch units such as the test switch unit 100, are installed within the electrical power generation and distribution systems. Furthermore, test switch units, such as the test switch unit 100 may be coupled to the trip circuit and the IED. Under normal operating conditions, the field supply current (interchangeably referred to as the "field current") generated from the appropriate generating components is provided to the field lead 104. The field current passes through the field lead 104 and through the trip contact element 110. Since the end 112 of the trip contact element 110 was previously in contact (as depicted in FIG. 1) with the conducting element 108 and because the test signal lead 106 is open, the field current travels through the trip contact element 110 and the conducting element 108, to the relay lead 102 and eventually through the trip circuit which may be coupled to relay lead 102.

For isolating the IED for testing, the lever 118 is moved in the direction depicted as direction B. The movement of the lever 118 in the direction B, affects the rotation of the shaft 116, which in turn causes the rotation of the cam 114. As the cam 114 rotates, the profiled element 120 of the cam 114 also moves in circular path approaching the trip contact element 110. As the profiled element 120 moves closer, it engages with the trip contact element 110. As the profiled element 120 moves further, it pushes the trip contact element 110 such that the end 112 moves in the direction depicted as direction C. As the end 112 moves away from the conducting element 108, it electrically decouples and opens the connection of the field lead 104 from the conducting element 108. Since the conducting element 108 is also connected to relay lead 102 and the test signal lead 106, the movement of the end 112 also decouples the field lead 104 from the relay lead 102 and the test signal lead 106. As the end 112 decouples from the conducting element 108, the trip circuit which may be coupled to the relay lead 102 is in an open state. The stage may then commence for shorting and isolating the CT circuit coupled with the IED. This is explained in conjunction with FIGS. 3-5.

Figure 3:
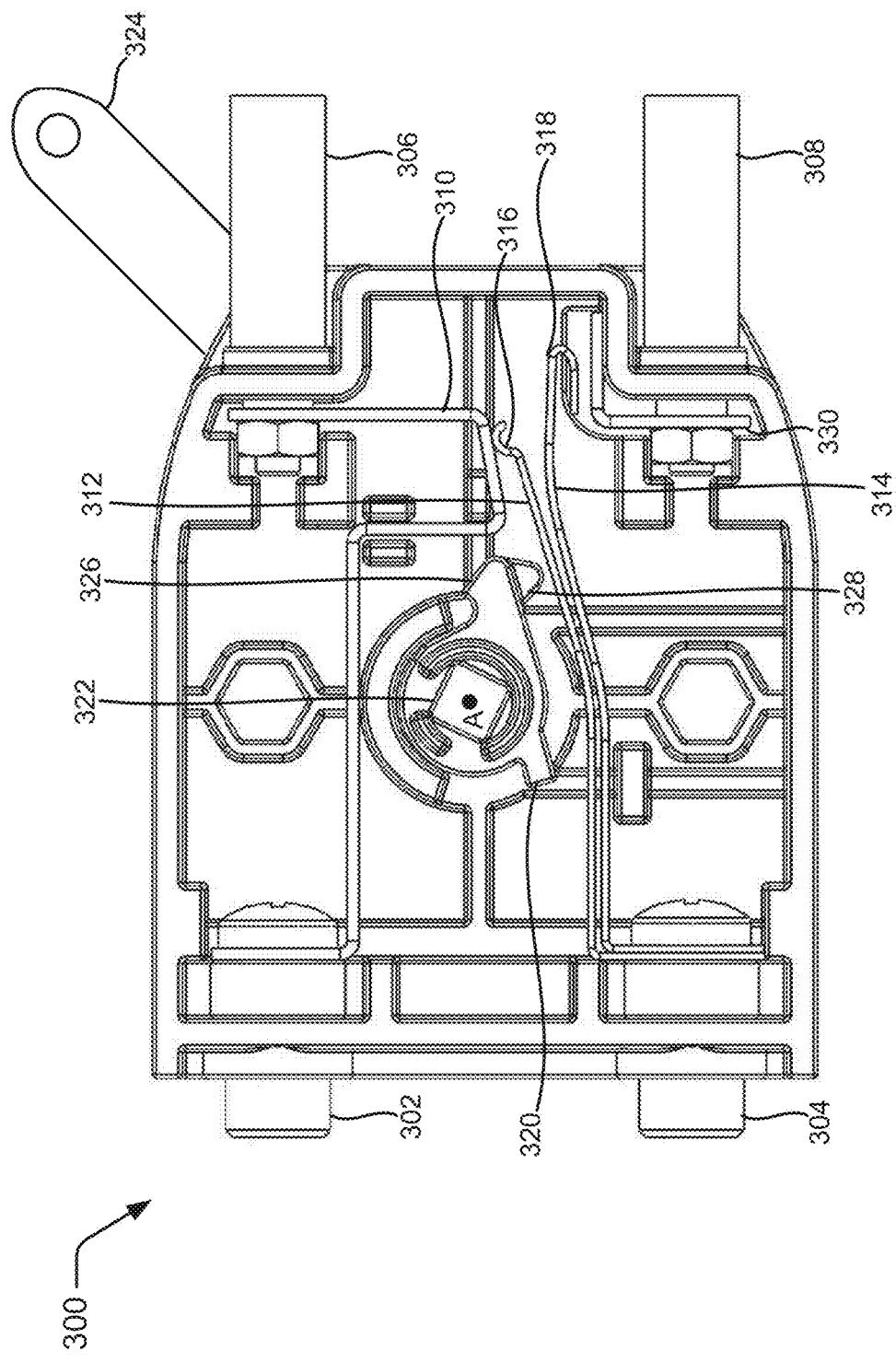
FIGS. 3-5 illustrates a cross-sectional view of a test switch unit in various stages of operation, in accordance with another implementation of the present subject matter.

FIG. 3 illustrates a cross-sectional view of a test switch unit 300, as per one example of the present subject matter. Units such as the test switch unit 300 may be further installed in a test system, wherein such test system may be utilized for testing intelligent electronic devices (IEDs) installed within power generation and distribution systems. As noted above, the present illustration depicts the test switch unit 300 in one example. Other examples may also be possible without deviating from the scope of the subject matter of the claims. The test switch unit 300 as described is such that it may be coupled to the CT circuits and the IED.

Returning to FIG. 3, the test switch unit 300 includes a rectangular shaped enclosure in which various components may be present. In one example, the test switch unit 300 includes a relay lead 302 and a field lead 304. The relay lead 302 is so adapted such that it may be coupled to the intelligent electronic device and corresponding CT circuit. As would be generally understood, the CT circuits are circuits which allow the transformation of the high current supplies to lower current supplies. Such transformations enable measurement of the current values, which otherwise may not be possible considering their high magnitude.

The field lead 304 is adapted to be coupled to the field current. The test switch unit 300 may further include a test signal lead 306 and another connecter port 308. The test signal lead 306 is electrically coupled to the relay lead 302 through a conducting element 310. The conducting element 310 may be in the form of a wired connector or may be a solid metallic plate which provides electric coupling between the relay lead 302 and the test signal lead 306.

Coupled to the field lead 304, the test switch unit 300 also includes a primary contact element 312 and a secondary contact element 314. One end of each of the primary contact element 312 and the secondary contact element 314 are connected with the field lead 304. The other ends of the primary contact element 312 and the secondary contact element 314, namely, the end 316 and end 318, respectively, are moveable by the cam 320. Each of the primary contact element 312 and the secondary contact element 314 may be manufactured from an electrically conducting and flexible material. In the present example, the end 316 of the primary contact element 312 abuts against the conducting element 310. In normal operation, when the test signal lead 306 is not utilized and is open, the primary contact element 312 provides an electrically conducting path for the field supply current from the field lead 304 to the CT circuit which may be coupled to the relay lead 302.

The secondary contact element 314, in the manner similar to the primary contact element 312, extends linearly away from the point where it is attached to the field lead 304. The end 318 of the secondary contact element 314 is, however, not in contact with any of the other components of the test switch unit 300. In one example, both the primary contact element 312 and the secondary contact element 314 are moveable. In one example, the movement of the primary contact element 312 and the secondary contact element 314 is affected through the cam 320.

The cam 320 is mounted on a shaft 322 which in turn is coupled to a lever 324. Similar to lever 118, the lever 324 is such that it is adapted to move in a notional plane which is perpendicular to the axis A about which the cam 320 is adapted to rotate. In one example, the lever 324 may be actuated manually or may be coupled, either directly or indirectly, through mechanically driven means. In case of the latter, such mechanically driven means may be actuated based on one or more control signals. The cam 320 is provided with a leading profiled element 326 and a trailing profiled element 328 (collectively referred to as the profiled elements 326, 328). The leading profiled element 326 is such that its leading edge extends beyond the leading edge of the trailing profiled element 328. As the cam 320 rotates, the profiled elements 326, 328 also moves on a circular path. The profiled elements 326, 328 may be cam lobes provided on the outer surface of the cam 320.

In one example, the length of the secondary contact element 314 may be greater than the length of the primary contact element 312, with the secondary contact element 314 being positioned just marginally beneath the primary contact element 312. In one example, both the primary contact element 312 and the secondary contact element 314 are shaped in the form of linearly extending sheets. In another example, the primary contact element 312 may be provided with a slot (not shown in FIG. 3) so shaped which allows the leading profiled element 326 to pass through and engage with the secondary contact element 314 (as explained later in conjunction with FIGS. 4-5), but without engaging with the primary contact element 312. In one example, the cross-sectional width of the trailing profiled element 328 is greater than width of the slot provided in the primary contact element 312. The test switch unit 300 may further include a short-circuit element 330 connected with the connecter port 308. The short-circuit element 330 may be a metallic plate having a surface to allow the end 318 of the secondary contact element 314 to come into contact with the short-circuit element 330.

Figure 8:
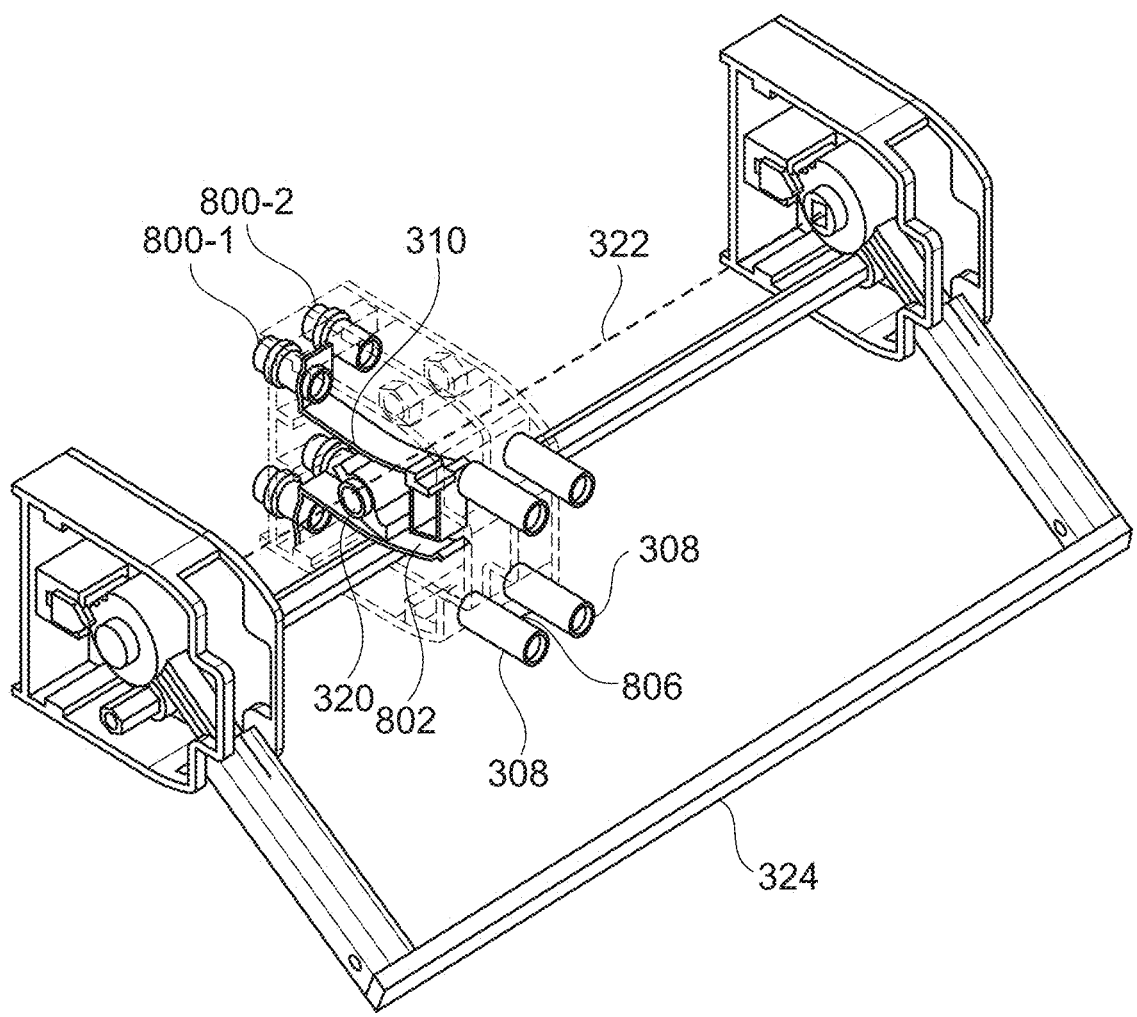
FIG. 8 illustrates an isometric view of the test switch unit, in accordance with one implementation of the present subject matter.

As explained previously, a test system may include a plurality of test switch units, such as test switch unit 300, which may be arranged adjacent to each other (as depicted in and explained in conjunction with FIG. 8). Each of the test switch units may be connected with each other. In one example, the connecter port 308 of one test switch unit 300 may be adapted to be electrically coupled to the connecter port 308 of an adjacently positioned test switch unit.

Returning to FIG. 3, in one example the relay lead 302 is coupled to an IED and CT circuit. The testing of the IED would involve the test signal lead 306 to be used for providing one or more test signals. Since the conducting element 310 provides an electrically conducting path for the field supply current between the field lead 304 to which the and the relay lead 302, utilizing the test signal lead 306 during normal operation may result in the electric supply current to pass through the test signal lead 306 as well. In order to ensure that the IED may be tested, the CT circuit is to be isolated. Isolation of the CT circuit requires that the conductive path for the field current is routed through the connecter port 308. To this end, the CT circuit is to be shorted. The manner in which the CT circuit is shorted is described further in conjunction with FIGS. 4-5. As would be explained, in the paragraphs that follow, the path for the field current is to be established prior to breaking the conductive path (i.e., the path established between the field lead 304 and the relay lead 302, through the conducting element 310).

Figure 4:
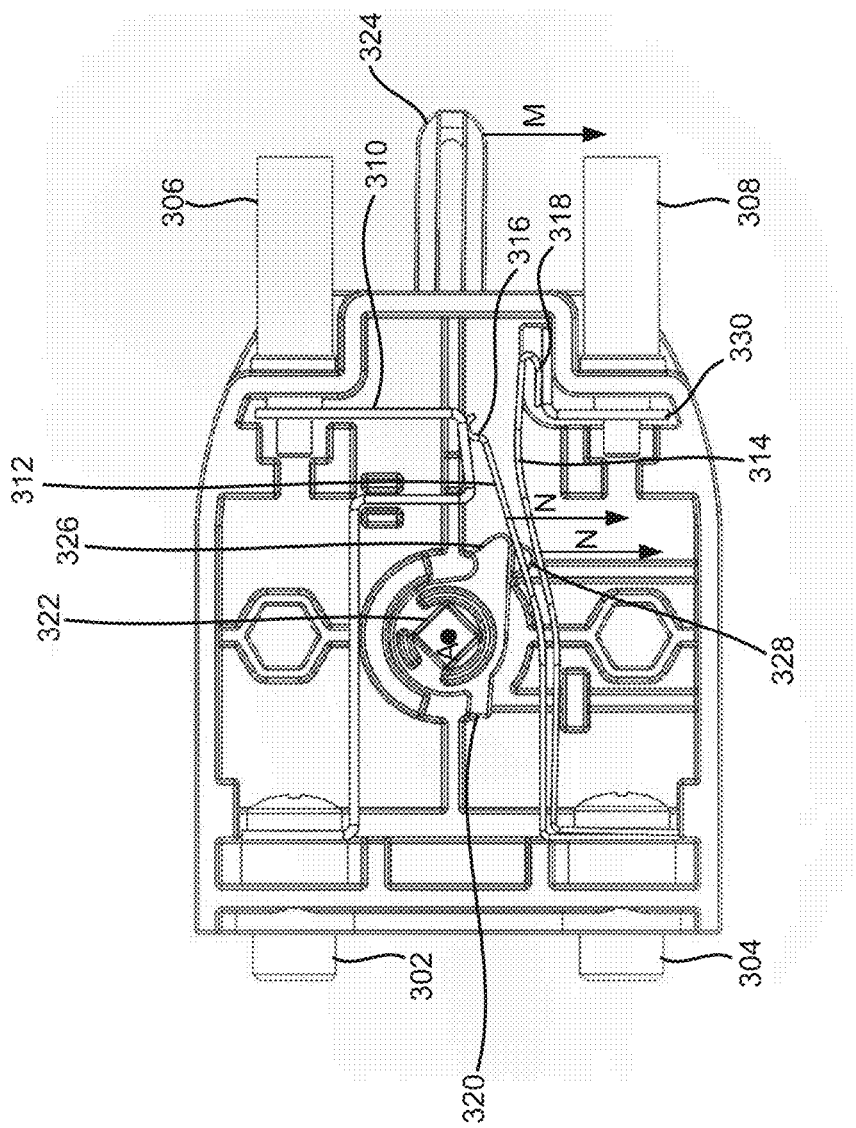
Figure 5:
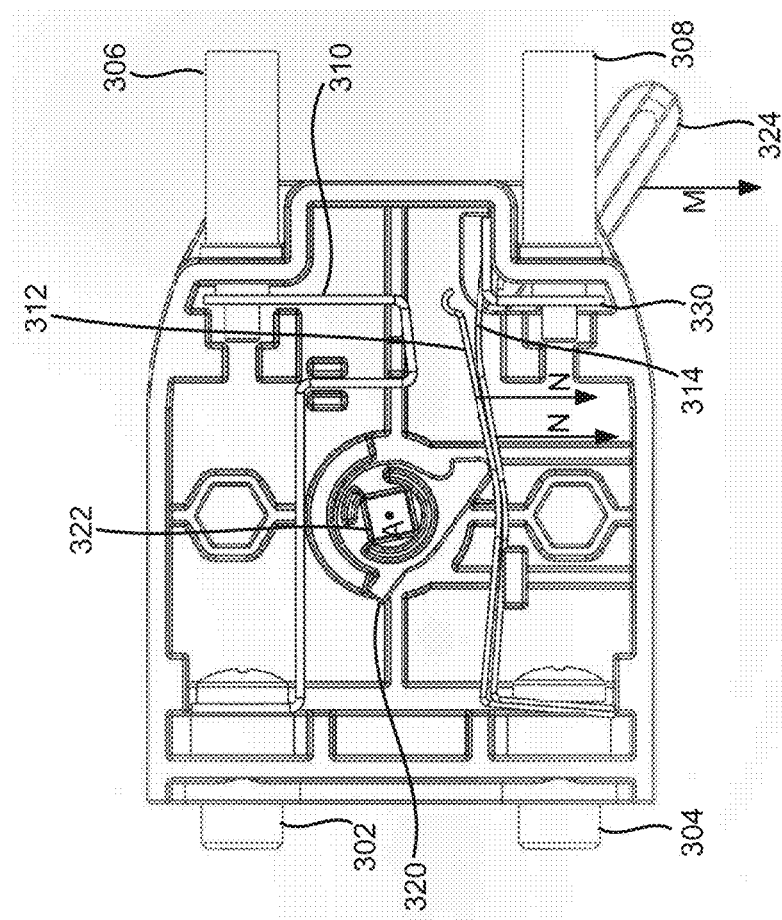

FIGS. 4-5 illustrates cross-sectional views of the test switch unit 300 in different stages of its working. As opposed to the trip circuit, which may be in an open state, i.e., non-conducting, the CT circuit cannot be opened in order to ensure that the field current is not disrupted. As described previously, test switch units such as the test switch unit 300, are installed within the electrical power generation and distribution systems. Furthermore, test switch units, such as the test switch unit 300 may be coupled to the trip circuit and the IED. Under normal operating conditions, the field current generated from the appropriate generating components is provided to the field lead 304. The field current passes through the field lead 304 and through the primary contact element 312. Since the end 316 of the trip contact element 312 is contact with the conducting element 308 and because the test signal lead 306 is open, the field current travels through the trip contact element 306 and the conducting element 308, to the relay lead 302 and eventually through the CT circuit which may be coupled to relay lead 302.

For isolating the CT circuit, the lever 324 is moved in the direction depicted as direction M. The movement of the lever 324 in the direction M, affects the rotation of the shaft 322, which in turn causes the rotation of the cam 320. As the cam 320 rotates, the leading profiled element 326 and the trailing profiled element 328 also moves in a circular path in the direction which is aligned with the direction M. As the leading profiled element 326 moves it passes through the slot present in the primary contact element 312. Without engaging with the primary contact element 312, the leading profiled element 326 proceeds and engages with the secondary contact element 314. As the cam 320 further rotates, the leading profiled element 326 pushes the secondary contact element 314 in the direction as shown (direction N). As the secondary contact element 314 continues to move in the direction N, it proceeds and abuts against the short-circuit element 330. Once the secondary contact element 314 is in contact with the short-circuit element 330, an alternate path for the field current is established between the field lead 304 and the connecter port 308 (FIG. 4).

Since the rotation of the lever 324 continues further down along the direction M, the cam 320 too continues to rotate. At this stage, the trailing profiled element 328 continues to move till it begins pushing the primary contact element 312 along direction N. The trailing profiled element 328 may now engage with the primary contact element 312. With the contact between the secondary contact element 314 and the short-circuit element 330 already established, the primary contact element 312 loses contact with the conducting element 310 thereby breaking the electrically conductive path, i.e., path between the field lead 304 and the relay lead 302, provided through the conducting element 310 (FIG. 5). At this stage, field lead 304 and the short-circuit element 330 (and hence in turn the connecter port 308) are connected to each other through the secondary contact element 314. The field current traversing through the field lead 304 and the secondary contact element 314 is then routed to the connecter port 308. In one example, the connecter port 308 may be further connected with a similar connector port in a test switch unit positioned to the adjacent to the test switch unit 300 within a test system. With the field current being routed through the connecter port 308 (as opposed to the relay lead 302), the CT circuit is shorted and the IED is isolated.

As has been described previously for testing the IED, the trip circuit has to be opened. Along with the opening of the trip circuit, the CT circuit is to be shorted and isolated, with VT circuits to be isolated. To such an end, with the trip circuit opened (as described in conjunction with FIGS. 1-2), and the CT circuit being shorted and isolated (as described in conjunction with FIGS. 3-5), the next steps involve isolation of the VT circuits. The isolation of the VT circuits is now described in conjunction with FIGS. 6-7.

Figure 6:
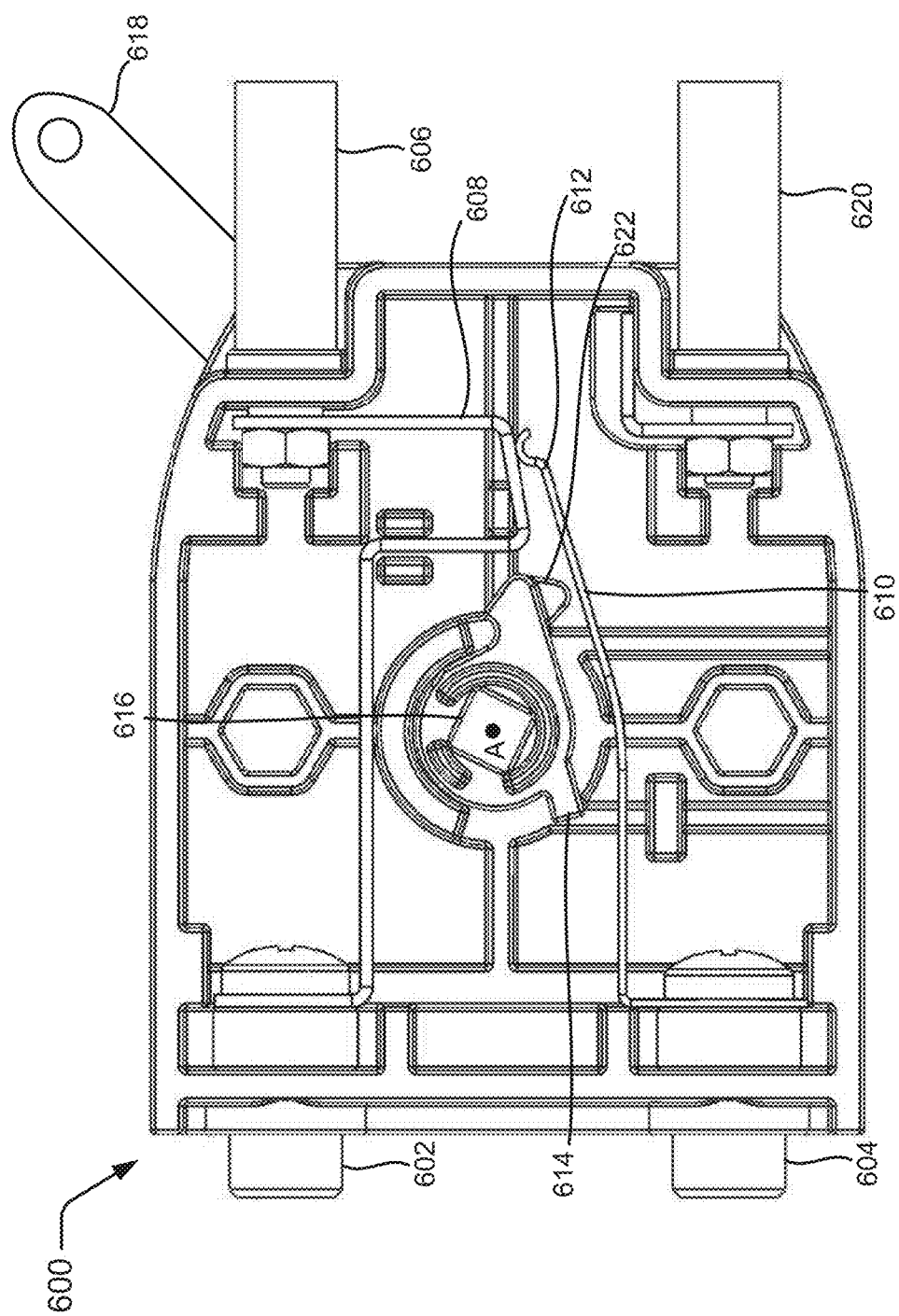
FIGS. 6-7 illustrates a cross-sectional view of a test switch unit in various stages of operation, in accordance with another implementation of the present subject matter.

FIG. 6 illustrates a cross-sectional view of a test switch unit 600 for isolating a VT circuit, as per one example of the present subject matter. Units such as the test switch unit 600 may be further installed in a test system, wherein such test system may be utilized for testing intelligent electronic devices (IEDs) installed within power generation and distribution systems. As noted above, the present illustration depicts the test switch unit 600 in one example. Other examples may also be possible without deviating from the scope of the subject matter of the claims.

The test switch unit 600 includes a relay lead 602 and a field lead 604. The relay lead 602 is so adapted such that it may be coupled to the intelligent electronic device and corresponding trip circuit. The field lead 604 on the other hand is adapted to be coupled to a field current. The test switch unit 600 may further include a test signal lead 606. The test signal lead 606 is electrically coupled to the relay lead 602 through a conducting element 608. The conducting element 608 may be in the form of a wired connector or may be a solid metallic plate which provides electric coupling between the relay lead 602 and the test signal lead 606.

Coupled to the field lead 604, the test switch unit 600 also includes a VT contact element 610. The VT contact element 610 may be manufactured from an electrically conducting and flexible material. One end of the VT contact element 610 is fixed with the field lead 604. In one example, the other end of the VT contact element 610, i.e., the end 612 is moveable. In the present example, the end 612 of the VT contact element 610 abuts against the conducting element 608. In normal operation, the test signal lead 606 is not utilized and is open, and the VT contact element 610 provides an electrically conducting path for the field current from the field lead 604 to the trip circuits which may be coupled to the relay lead 602.

The test switch unit 600 may further include a cam 614 mounted on a shaft 616. The shaft 616 is further coupled to a lever 618. The lever 618 is such that it is adapted to move in a notional plane which is perpendicular to the axis about which the cam 614 is adapted to rotate. The cam 614 is provided with a profiled element 622 which also moves in a circular path, as the cam 614 rotates. In one example, the lever 618 may be actuated manually or may be coupled, either directly or indirectly, through mechanically driven means. In case of the latter, such mechanically driven means may be actuated based on one or more control signals.

As described previously, the relay lead 602 may be coupled to an IED and a VT circuit. The testing of the IED would involve the test signal lead 606 to be used for providing one or more test signals. Since the conducting element 608 provides an electrically conducting path for the field current between the field lead 604 (to which the and the relay lead 602, utilizing the test signal lead 606 during normal operation may result in the field current to pass through the test signal lead 606 as well. To this end, the VT circuit is opened so that no field current passes through test signal lead 606 using the test switch unit 600. The manner in which the test switch unit 600 operates is further described in conjunction with FIG. 7.

Figure 7:
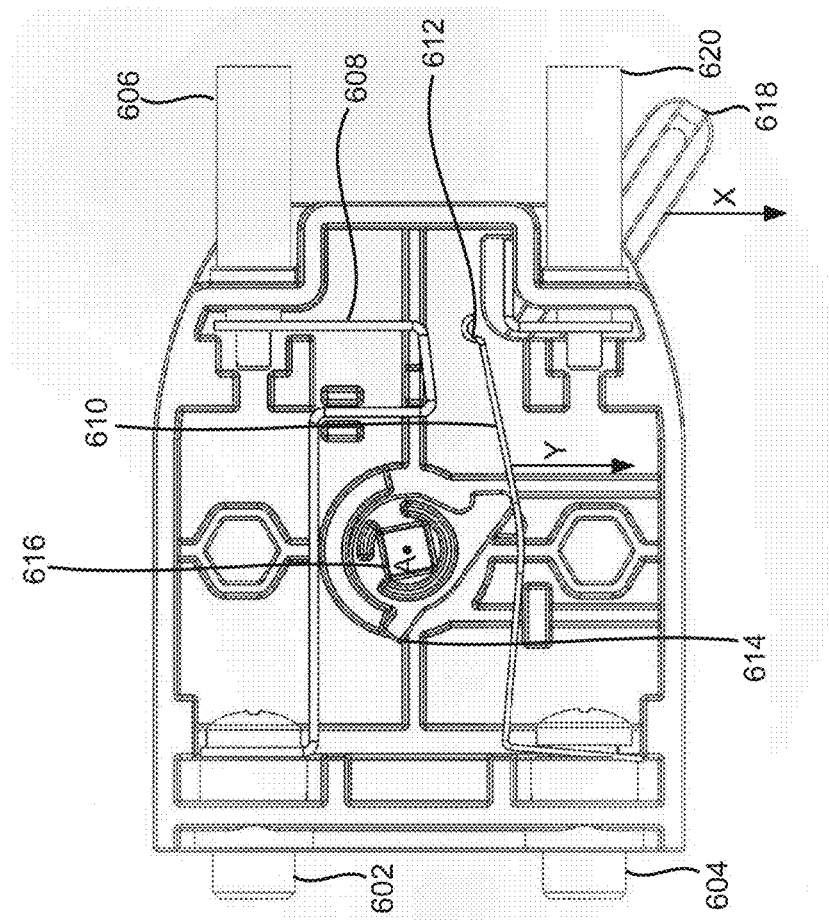

FIG. 7 illustrates a cross-sectional view of the test switch unit 600 in different stages of its working. Under normal operating conditions, the field current generated from the appropriate generating components is provided to the field lead 604. The field current passes through the field lead 604 and through the VT contact element 610. Initially the end 612 of the VT contact element 610 is in contact with the conducting element 608 and because the test signal lead 606 is open, the field current travels through the VT contact element 610 and the conducting element 608, to the relay lead 602 and eventually through the trip circuit which may be coupled to relay lead 602.

For isolating the IED for testing, the lever 618 is moved in the direction depicted as direction X. The movement of the lever 618 in the direction X, affects the rotation of the shaft 616, which in turn causes the rotation of the cam 614. As the cam 614 rotates, the profiled element 622 of the cam 614 also moves in circular path approaching the VT contact element 610. As the profiled element 622 moves closer, it engages with the VT contact element 610. As the profiled element 622 moves further, it pushes the VT contact element 610 such that the end 612 moves in the direction depicted as direction Y. As the end 612 moves away from the conducting element 608, it electrically decouples and opens the connection of the field lead 604 from the conducting element 608. Since the conducting element 608 is also connected to relay lead 602 and the test signal lead 606, the movement of the end 612 also decouples the field lead 604 from the relay lead 602 and the test signal lead 606, thereby completely isolating the VT circuit.

With the trip circuit isolated (as explained in conjunction with FIGS. 1-2), the CT circuit shorted and isolated (as explained in conjunction with FIGS. 3-5), and the VT circuit isolated (as explained in conjunction with FIGS. 6-7), the testing of the IED may be initiated. In such cases, the one or more test signals may be provided to the test signal lead 606 for testing the IED coupled to the relay lead 602. FIG. 8 illustrates isometric views of the different stages of two test switch units 800-1 and 800-2, similar to the test switch unit 300, provided within a test system 800 for testing an intelligent electronic device installed in an electric substation, as per one example. In an example, the test system 800 may have a plurality of test switch units, in addition to test switch units 800-1 and 800-2. It should be noted that the type of test switch unit would be dependent on the type of circuit, i.e., any one of the trip, CT and the VT circuit is to be isolated. As would be observed, the lever 324 is coupled to the shaft 322 (depicted through a dotted line for sake of clarity), which extends through the test switch units 800-1 and 800-2.

In the present example, the connecter port 308 of the adjacent test switch units 800-1-800-2 are connected through a contact 806. FIG. 8 depicts the stages as explained in conjunction with FIG. 3-5 for isolating the CT circuit for testing the IED. In operation, the lever 324 is moved in the direction depicted as direction M, which in turn causes the rotation of the cam 320. As the cam 320 rotates, the leading profiled element 326 and the trailing profiled element 328 moves in a circular path. As the leading profiled element 326 moves it passes through the slot present in the primary contact element 312. Without engaging with the primary contact element 312, the leading profiled element 326 proceeds and engages with the secondary contact element 314. As the cam 320 further rotates, the leading profiled element 326 pushes the secondary contact element 314 in the direction as shown (direction N). As the secondary contact element 314 continues to move in the direction N, it proceeds and abuts against the short-circuit element 330. Once the secondary contact element 314 is in contact with the short-circuit element 330, an alternate path for the field current is established between the field lead 304 and the connecter port 308.

The trailing profiled element 328 continues till it begins pushing the primary contact element 312 along direction N. The trailing profiled element 328 may now engage with the primary contact element 312. With the contact between the secondary contact element 314 and the short-circuit element 330 already established, the primary contact element 312 loses contact with the conducting element 310 thereby breaking the electrically conductive path, i.e., path between the field lead 304 and the relay lead 302, provided through the conducting element 310 (as is depicted in FIG. 8). At this stage, field lead 304 and the short-circuit element 330 (and hence in turn the connecter port 308) are connected to each other through the secondary contact element 314. The field current traversing through the field lead 304 and the secondary contact element 314 is then routed to the connecter port 308.

The connecter ports 308 of both the test switch units 800-1 and 800-2 may be further connected through a connector 806, with each other. In this manner, the field current is routed through from the field lead 304 to the connecter ports 308 of the test switch units 802-1 and 802-2. It may be noted that the present example has been explained depicting only two test switch units, namely, units 800-1 and 800-2. Additional number of test switch units, such as test switch units 100, 600 may also be used without deviating from the scope of the present subject matter. For example, the test system 800 may include test switch units 100, 300, and 600. In such a case, actuation of the lever 324 will result in the movement of the cam (e.g., cams 114, 320, 614) in each of the test switch units (e.g., test switch units 100, 300, 600) and accordingly isolate the appropriate circuits. In such instances, the test switch units 100, 300 and 600 would operate in the manner as described in conjunction with the preceding figures.

Methods for operating test system 800 comprising first test switch unit (e.g., test switch unit 100), a second test switch unit (e.g., test switch unit 300) and the third test switch unit (e.g., test switch unit 600), are described. In one example, the method involves engaging a lever, such as the lever 324. The lever 324 is, in turn, coupled to cams, i.e., cam 114, cam 320 and cam 614 of the respective test switch units 100, 300, 600. The movement of the lever 324 affects the rotation of cam 114, cam 320 and cam 614. As each of the cam 114, cam 320 and cam 614 rotates, it results in the opening of the trip circuit coupled to the first test switch unit 100 upon the cam 114 engaging with the trip contact element 112 of the test switch unit 100. Along with the movement of cam 114, the cam 320 also moves. The cam 320 includes a leading profiled element 326 and a trailing profiled element 328. As the cam 320 moves, the leading profiled element 326 of the cam 320 engages with the secondary contact element 314 and the trailing profiled element 328 of the cam 320 engages with the primary contact element 312. In a similar manner, rotation of the cam 614 affects isolation of the VT circuit when the cam 614 engages with the VT contact element 610.

It may be noted that the various examples of the test switches described in conjunction with the previous figures, may be implemented by way of other examples, which too, would fall within the scope of the present subject matter. Such examples are further described in conjunction with FIGS. 9-17.

Figure 9:
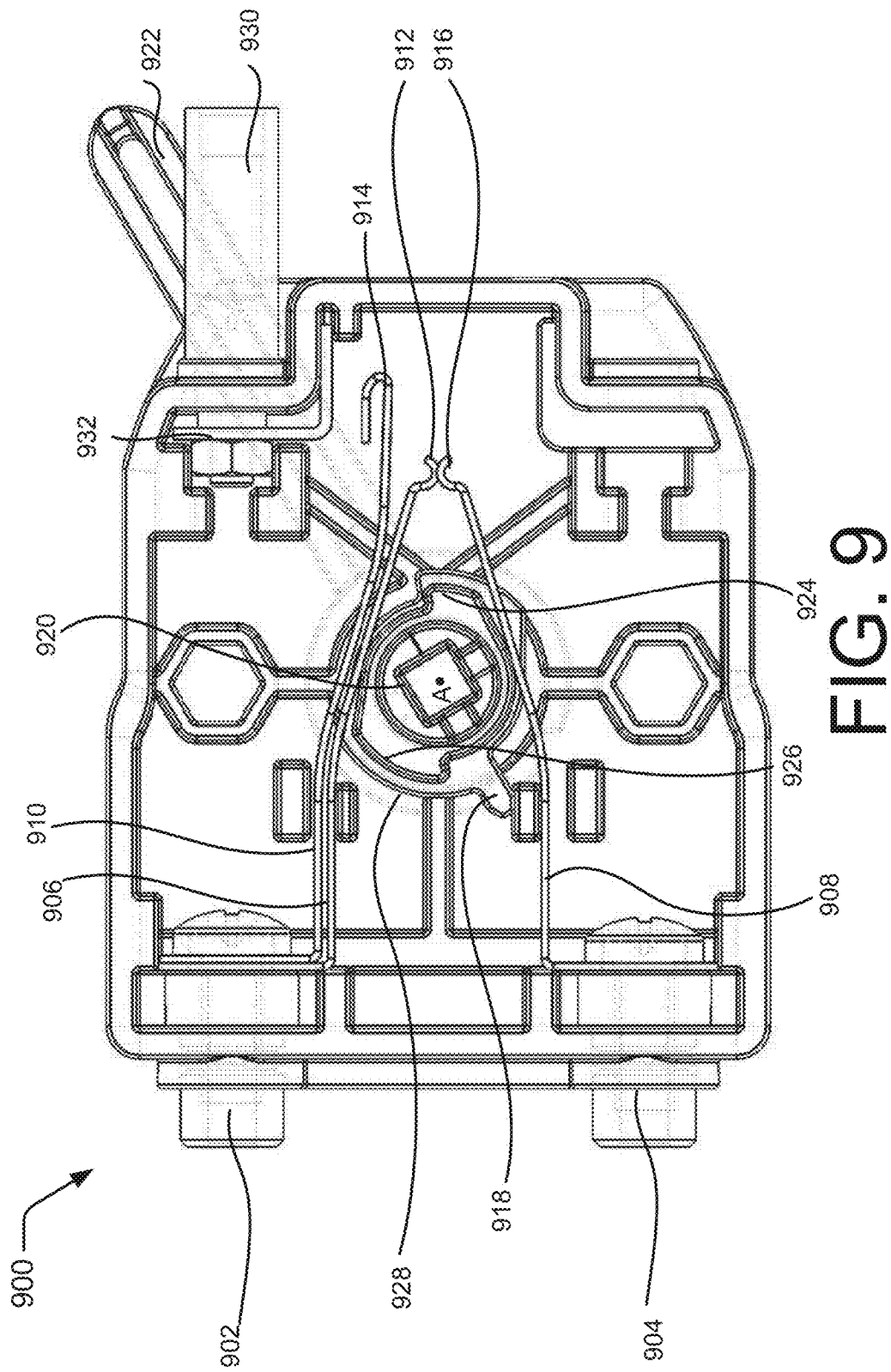
FIG. 9-11 illustrates a cross-sectional view of a test switch unit for opening a trip circuit, in various stages.

FIG. 9 illustrates a cross-sectional view of a test switch unit 900 for opening a trip circuit, as per another the present subject matter. In one example, the test switch unit 900 includes relay lead 902 and field lead 904. The relay lead 902 is adapted such that it may be coupled to the IED and the corresponding trip circuit. On the other hand, the field lead 904 is adapted to be coupled to a field supply current. The test switch unit 900 also includes a first primary contact element 906, a second primary contact element 908 (collectively referred to as primary contact elements 906 and 908) and a secondary contact element 910. In one case, the primary contact elements 906 and 908 and the secondary contact element 910 may be manufactured from an electrically conducting and flexible material. It may be noted that the primary contact element 908 may be similar to the trip contact element 110 (as explained in conjunction with FIGS. 1-2).

Within the test switch unit 900, one end of both the first primary contact element 906 and the secondary contact element 910 are connected with the relay lead 902 with the other respective ends, i.e., the ends 912, 914 being free. Similarly, one end of the second primary contact element 908 is connected with the field lead 904 with the other end of the second primary contact element 908, i.e., end 916 also not affixed to any portion of the test switch unit 900. As a result, each of the contact elements 906, 908, 910 are affixed at one end and moveable at the other. The test switch unit 900 further comprises cam 918. In one example, portions of the cam 918 may engage with the contact elements 906, 908, 910 as a result of which each contact element 906, 908, 910 moves about the point to which the respective points where they are fixed.

The cam 918 is mounted on a shaft 920 which in turn is coupled to a lever 922. Similar to lever 118, the lever 922 is such that it is adapted to move in a notional plane which is perpendicular to the axis A about which the cam 918 is adapted to rotate. In one example, the lever 922 may be actuated manually or may be coupled, either directly or indirectly, through mechanically driven means. In case of the latter, such mechanically driven means may be actuated based on one or more control signals. The cam 918 is provided with set of inner profiled elements 924, 926 and an outer profiled element 928. The inner profiled elements 924, 926 are so defined on the cam 918 such that the inner profiled elements 924, 926 are disposed nearly diametrically with respect to each other. As the cam 918 rotates, the inner profiled elements 924, 926 are to contact and move the primary contact elements 906, 908, whereas the outer profiled element 928 is to contact and move the secondary contact element 910.

Continuing with the present example, the test switch unit 900 further includes a test signal lead 930 connected to a conducting element 932. The conducting element 932 may be a metallic plate having a surface to allow the end 914 of the secondary contact element 910 to come into contact with the conducting element 932. As described previously, the relay lead 902 may be coupled to an IED and a trip circuit. The testing of the IED would involve the test signal lead 930 to be used for providing one or more test signals. As explained in conjunction with FIG. 1, for testing, the trip circuit is opened by moving the lever 922 so that no field supply current passes through the lever 922 using the test switch unit 900. The manner in which the test switch unit 900 operates is further described in conjunction with FIG. 10-11.

Figure 10:
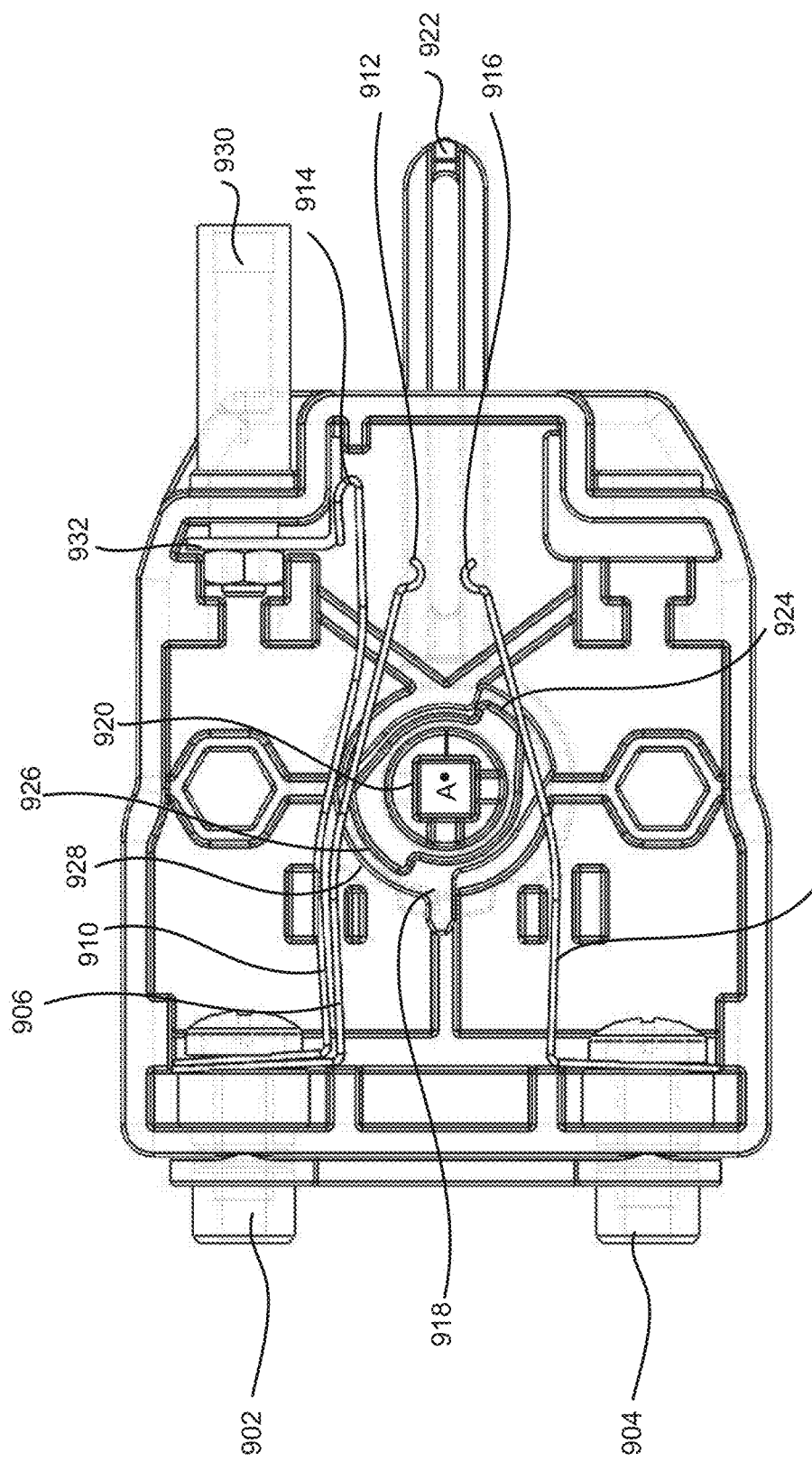
Figure 11:
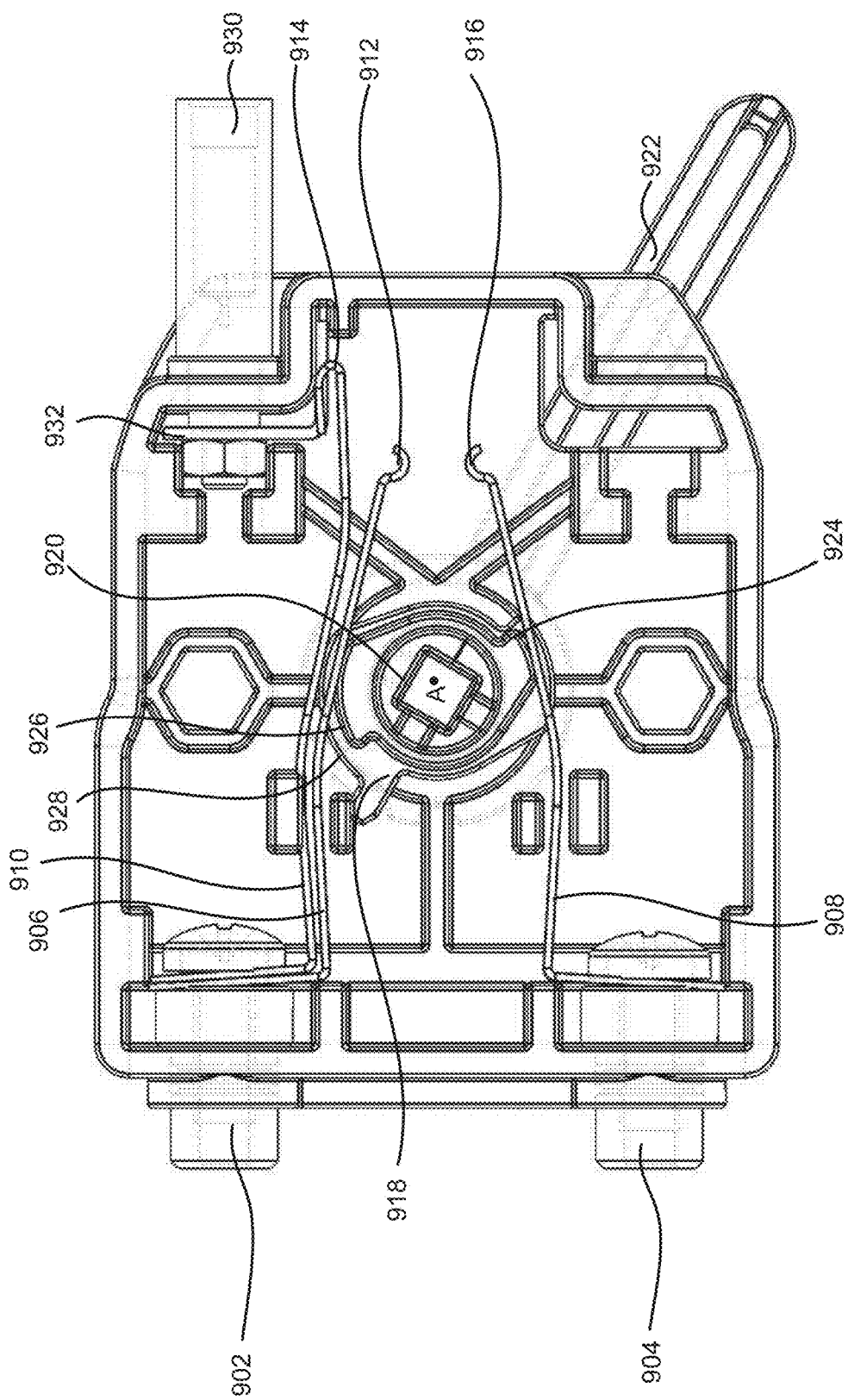

FIG. 10-11 illustrates the example test switch unit 900 coupled to the trip circuit and the IED, in various stages of operation. Under normal operating conditions, the field supply current (interchangeably referred to as the "field current") generated from the appropriate generating components is provided to the field lead 904. The field current passes through the field lead 904 and through the second primary contact element 908. Since the first end 912 of the first primary contact element 906 were previously in contact, with the end 916 of the second primary contact element 908 (as depicted in FIG. 9) and because the test signal lead 930 is open, the field current travels through the pair of primary contact elements 906, 908, to the relay lead 902 and eventually through the trip circuit which may be coupled to relay lead 902.

For isolating the IED for testing, the lever 922 is moved downwards direction B, as depicted in FIGS. 10-11. The movement of the lever 922 affects the rotation of the shaft 920, which in turn causes the rotation of the cam 918. As the cam 918 rotates, the inner profiled elements 924, 926 also move in circular path. As the inner profiled elements 924, 926 moves it pushes against the primary contact elements 906, 908. As the opposing inner profiled elements 924, 926 pushes against the primary contact elements 906, 908, the primary contact elements 906, 908 are pushed apart thereby breaking the contact between them (FIG. 10).

As the lever 922 is further pushed in the downward direction, the cam 918 rotates further such that the outer profiled element 928 moves towards the secondary contact element 910. As the lever 922 is pushed further down, the outer profiled element 928 continues to move towards the secondary contact element 910. The outer profiled element 928 may subsequently push against the secondary contact element 910 thereby resulting in the secondary contact element 910 to move towards and eventually contacts the conducting element 932 (FIG. 11).

With the contact between the secondary contact element 910 and the conducting element 932 already established and with the primary contact elements 906, 908 no longer in electrical contact, the electrically conductive path, i.e., path between the field lead 904 and the relay lead 902, provided through the pair of primary contact elements 906 and 908 is disrupted. At this stage, field lead 904 and the conducting element 932 (and hence in turn the test signal lead 930) are connected to each other through the secondary contact element 910. As the end 914 couples with the conducting element 932, the trip circuit which may be coupled to the relay lead 902 is in an open state. The stage may then commence for shorting and isolating the CT circuit coupled with the IED. This is explained in conjunction with FIGS. 12-14.

Figure 12:
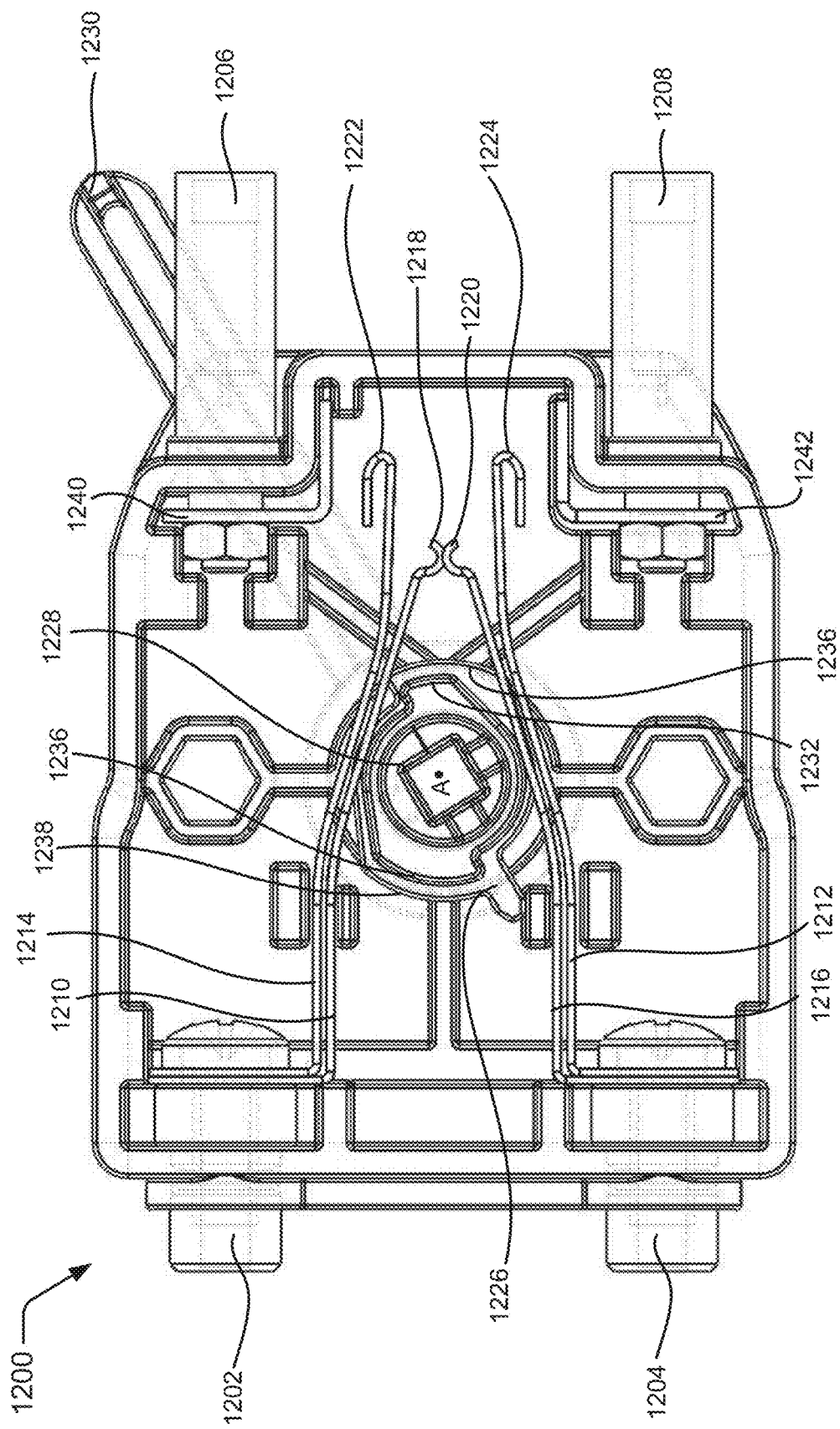
FIG. 12-14 illustrates a cross-sectional view of a test switch unit, for isolation of a Current Transformer (CT) circuit, in various stages as per another example of the present subject matter.

FIG. 12 illustrates a cross-sectional view of a test switch unit 1200, as per another example of the present subject matter, wherein the test switch unit 1200 is coupled to an IED and CT circuit. The test switch unit 1200 as described is such that it may be coupled to the CT circuits and the IED. The test switch unit 1200 includes a relay lead 1202 and a field lead 1204. The relay lead 1202 is so adapted such that it may be coupled to the intelligent electronic device and corresponding CT circuit.

The field lead 1204 is adapted to be coupled to the field current. The test switch unit 1200 may further include a test signal lead 1206 and a connecter port 1208. The test switch unit 1200 also includes a first primary contact element 1210, a second primary contact element 1212, (collectively referred as primary contact elements 1210, 1212), and a first secondary contact element 1214, and a second secondary contact element 1216 (collectively referred as secondary contact elements 1214, 1216). One end of each of the first primary contact element 1210 and the first secondary contact element 1214 are connected with the relay lead 1202. Similarly, one end of each of the second primary contact element 1212 and the other secondary contact element 1216 are connected with the field lead 1204. The other ends 1218, 1220 of the primary contact elements 1210, 1212 and the end 1222, 1224 of the secondary contact elements 1214, 1216 are free and not affixed to any portion of the test switch unit 1200. The primary contact elements 1210, 1212 and the secondary contact elements 1214, 1216 may be manufactured from an electrically conducting and flexible material. In normal operation, when the test signal lead 1206 is not utilized and is open, the pair of primary contact element 1212 and 1214 provides an electrically conducting path for the field supply current from the field lead 1204 to the CT circuit which may be coupled to the relay lead 1202. It may be noted that the primary contact element 1212 and the secondary contact element 1216 may be similar to the primary contact element 312 and the secondary contact element 314 (described in FIGS. 3-5), respectively.

The test switch unit 1200 further includes a cam 1226 is mounted on a shaft 1228, which in turn is coupled to a lever 1230. Similar to lever 118, the lever 1230 is such that it is adapted to move in a notional plane which is perpendicular to the axis A about which the cam 1226 is adapted to rotate. The cam 1226 is provided with set of inner profiled elements 1232, 1234 and the outer profiled elements 1236, 1238. The inner profiled elements 1232, 1234 are so defined on the cam 1226 such that the inner profiled elements 1232, 1234 are disposed nearly diametrically with respect to each other. In a similar manner, the outer profiled elements 1236, 1238 are disposed nearly diametrically with respect to each other. The outer profiled elements 1236, 1238 are such that they traverse a circular path having a larger radius when compared with the inner profiled elements 1232, 1234.

In operation, as the cam 1226 rotates, the inner profiled elements 1232, 1234 are to contact and move the primary contact elements 1210, 1212, whereas the outer profiled elements 1236, 1238 is to contact and move the secondary contact elements 1214, 1216. The test switch unit 1200 may further include conducting elements 1240, 1242, each connected with the connecter port 1208 and the test signal lead 1206, respectively. The conducting elements 1240, 1242 may be a metallic plate having a surface to allow the ends 1222, 1224 of the secondary contact elements 1214, 1216 to come into contact with the conducting elements 1240, 1242.

In order to ensure that the IED may be tested, the CT circuit is to be isolated. Isolation of the CT circuit requires that the conductive path for the field current is routed through the connecter port 308. To this end, the CT circuit is to be shorted. The manner in which the CT circuit is shorted is described further in conjunction with FIGS. 13-14. As would be explained, in the paragraphs that follow, the path for the field current is to be established prior to breaking the conductive path (i.e., the path established between the field lead 1204 and the relay lead 1202, through the conducting elements 1240, 1242).

Initially, the ends 1218, 1220 of the primary contact elements 1210, 1212 are in contact, with neither of the secondary contact elements 1214, 1216 being in contact with the conducting elements 1240, 1242 (FIG. 12). As a result, the field current travels through the pair of primary contact elements 1210 and 1212, to the relay lead 1202 and eventually through the CT circuit which may be coupled to relay lead 1202.

Figure 13:
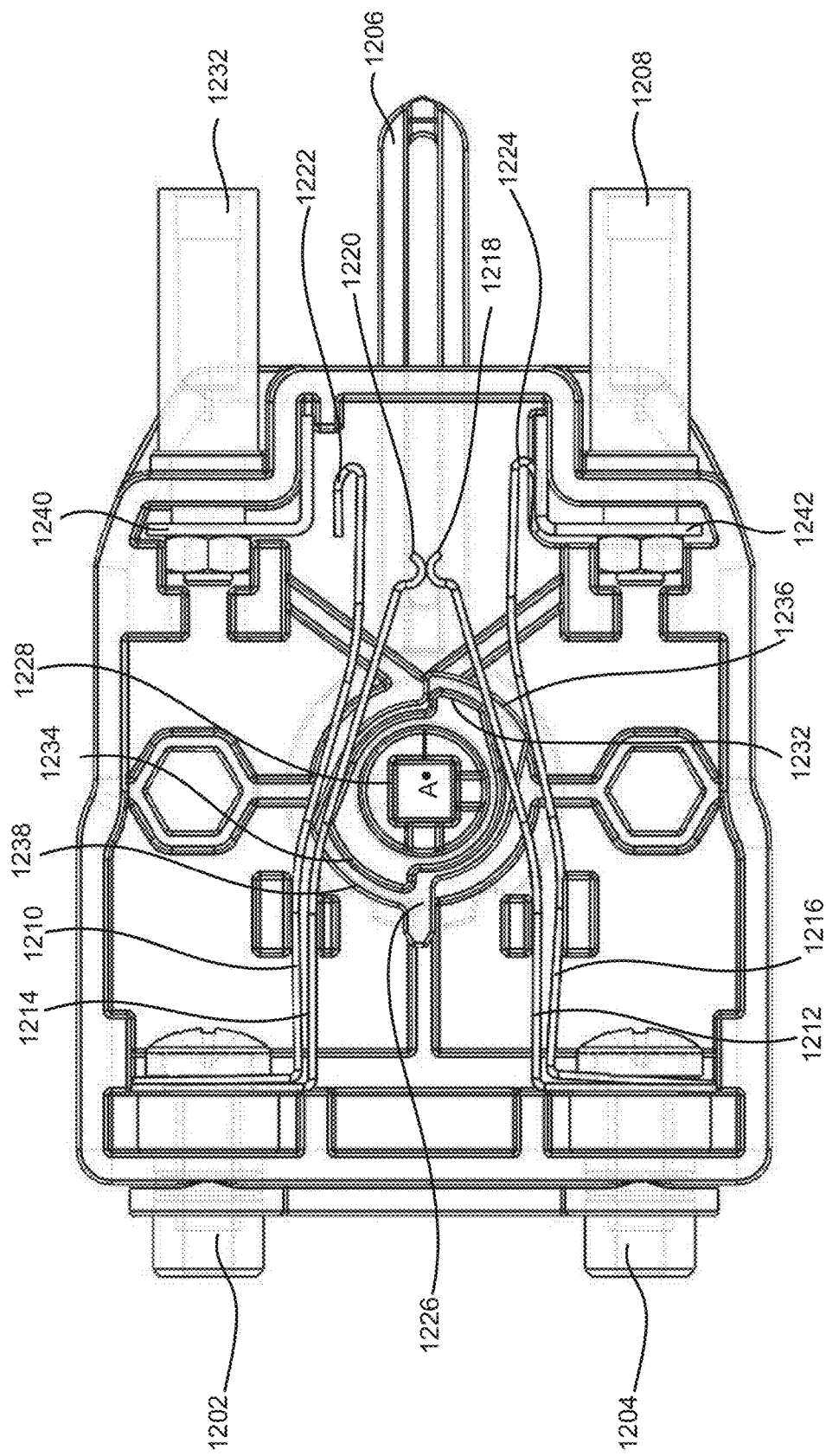

For isolating the CT circuit, the lever 1230 is moved in the direction M. The movement of the lever 1230 in the direction M, affects the rotation of the shaft 1228, which in turn causes the rotation of the cam 1226. As the cam 1226 rotates, the inner profiled elements 1232, 1234 also move in circular path and push against the primary contact elements 1210, 1212. As the opposing inner profiled elements 1232, 1234 pushes against the primary contact elements 1210, 1212, the primary contact elements 1210, 1212 are pushed apart thereby breaking the contact between them. In a similar manner, the outer profiled elements 1236, 1238 moves towards the secondary contact elements 1214, 1216. As the lever 1230 is pushed further down, the outer profiled elements 1236, 1238 continue to move towards the respective secondary contact elements 1214, 1216. The outer profiled elements 1236, 1238 may subsequently push against the secondary contact elements 1214, 1216 to move towards and eventually contact the conducting elements 1240, 1242 (FIG. 13).

Figure 14:
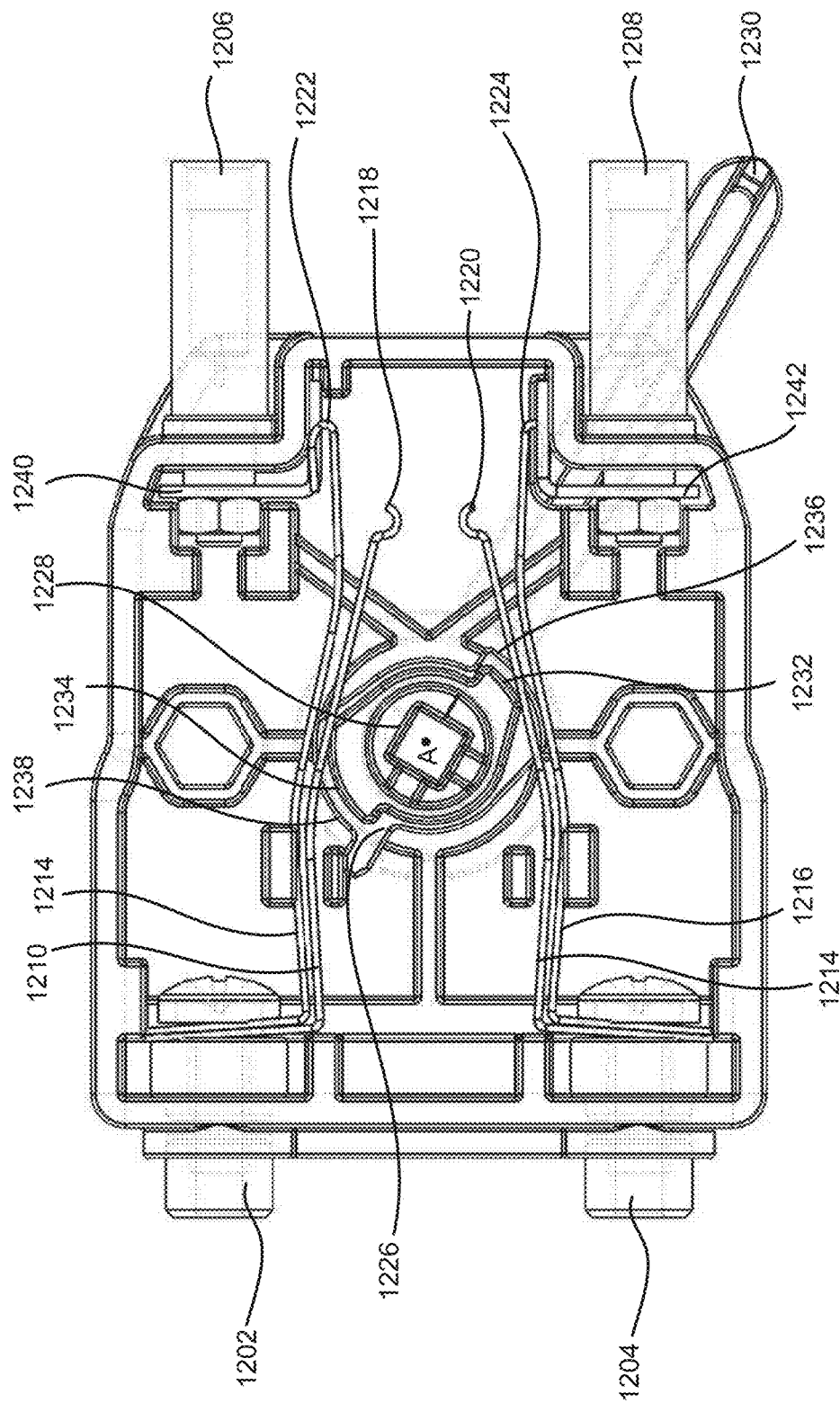

With the contact between the secondary contact elements 1214, 1216 and the conducting elements 1240, 1242 already established, the primary contact elements 1210, 1212 loses contact with each other, thereby breaking the electrically conductive path, i.e., path between the field lead 1204 and the relay lead 1202 (FIG. 14). At this stage, the relay lead 1202 and the field lead 1204 are in electrical connection with the conducting elements 1240, 1242. The field current traversing through the field lead 1204 and the secondary contact element 1216 may then be routed to the connecter port 1208. In one example, the connecter port 1208 may be further connected with a similar connector port in a test switch unit positioned to the adjacent to the test switch unit 1200 within a test system. With the field current being routed through the connecter port 1208 (as opposed to the relay lead 1202), the CT circuit is shorted and the IED is isolated.

As has been described previously for testing the IED, the VT circuit has to be opened. Along with the opening of the trip circuit, the CT circuit is to be shorted and isolated, with VT circuits to be isolated. To such an end, with the trip circuit opened (as described in conjunction with FIGS. 9-11), and the CT circuit being shorted and isolated (as described in conjunction with FIGS. 12-14), the next steps involve isolation of the VT circuits. The isolation for the VT circuits is now described in conjunction with FIGS. 15-17.

Within the test switch unit 1500, one end of both the first primary contact element 1506 and the secondary contact element 1510 are connected with the relay lead 1502 with the other respective ends, i.e., the ends 1512, 1514 being free. Similarly, one end of the second primary contact element 1508 is connected with the field lead 1504 with the other end of the second primary contact element 1508, i.e., end 1516 also not affixed to any portion of the test switch unit 1500. As a result, each of the contact elements 1506, 1508, 1510 are affixed at one end and moveable at the other. The test switch unit 1500 further comprises cam 1518. In one example, portions of the cam 1518 may engage with the contact elements 1506, 1508, 1510 as a result of which each contact element 1506, 1508, 1510 move about the point to which the respective points where they are fixed. It may be noted that the primary contact element 1508 may be similar to the VT contact element 610 (described in FIGS. 6-8), respectively.

The cam 1518 is mounted on a shaft 1520 which in turn is coupled to a lever 1522. The lever 1522 is such that it is adapted to move in a notional plane which is perpendicular to the axis A about which the cam 1518 is adapted to rotate. The cam 1518 is provided with set of inner profiled elements 1524, 1526 and an outer profiled element 1528. The inner profiled elements 1524, 1526 are so defined on the cam 1518 such that the inner profiled elements 1524, 1526 are disposed nearly diametrically with respect to each other. As the cam 1518 rotates, the inner profiled elements 1524, 1526 are to contact and move the primary contact elements 1506, 1508, whereas the outer profiled element 1528 is to contact and move the secondary contact element 1510.

Continuing with the present example, the test switch unit 1500 further includes a test signal lead 1530 connected to a conducting element 1532. The conducting element 1532 may be a metallic plate having a surface to allow the end 1514 of the secondary contact element 1510 to come into contact with the conducting element 1532. The manner in which the test switch unit 1500 operates is further described in conjunction with FIGS. 16-17.

Figure 15:
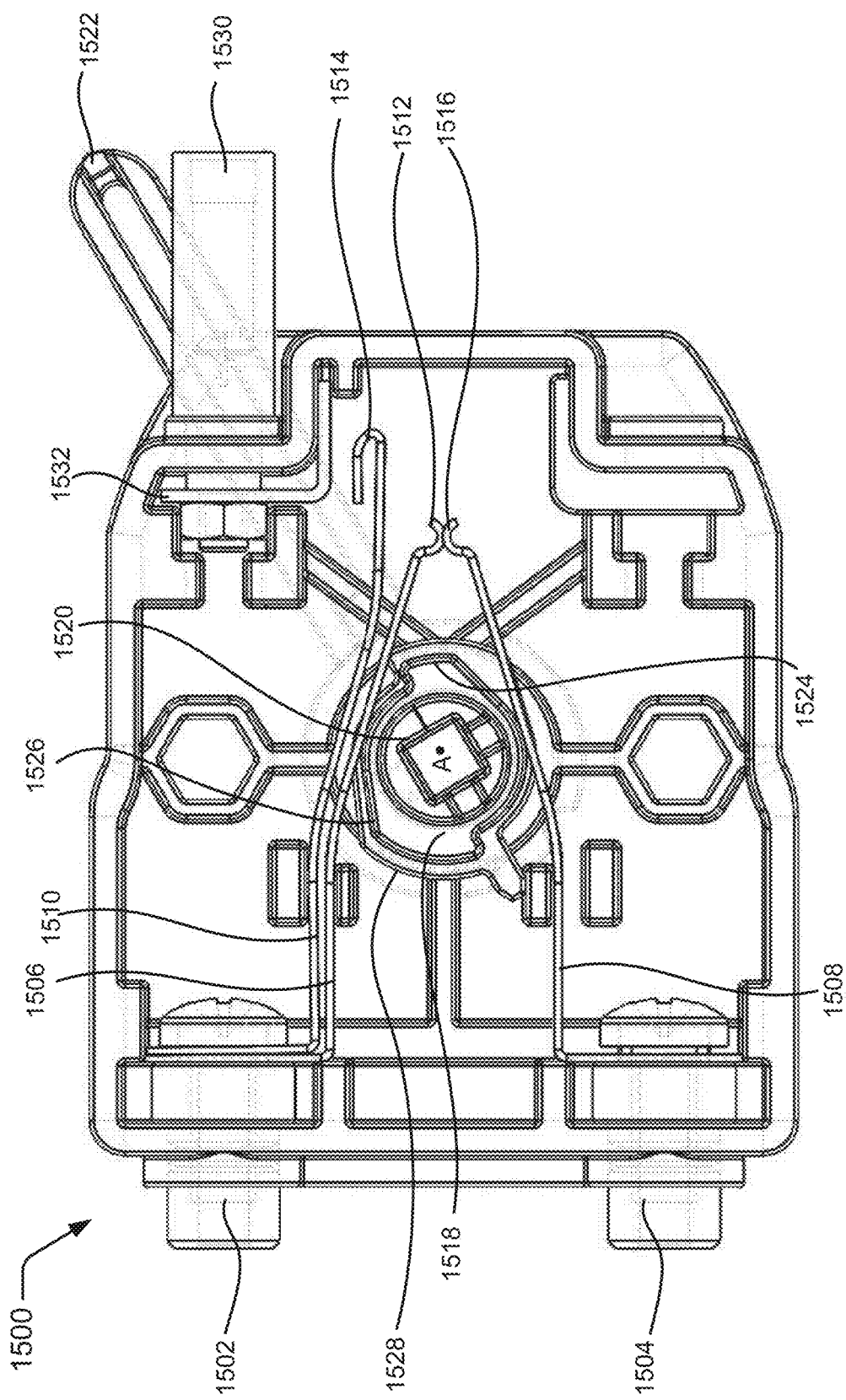
FIG. 15-17 illustrates a cross-sectional view of a test switch unit, for shorting of a Voltage Transformer (VT) circuit, in various stages as per yet another example of the present subject matter.
Figure 16:
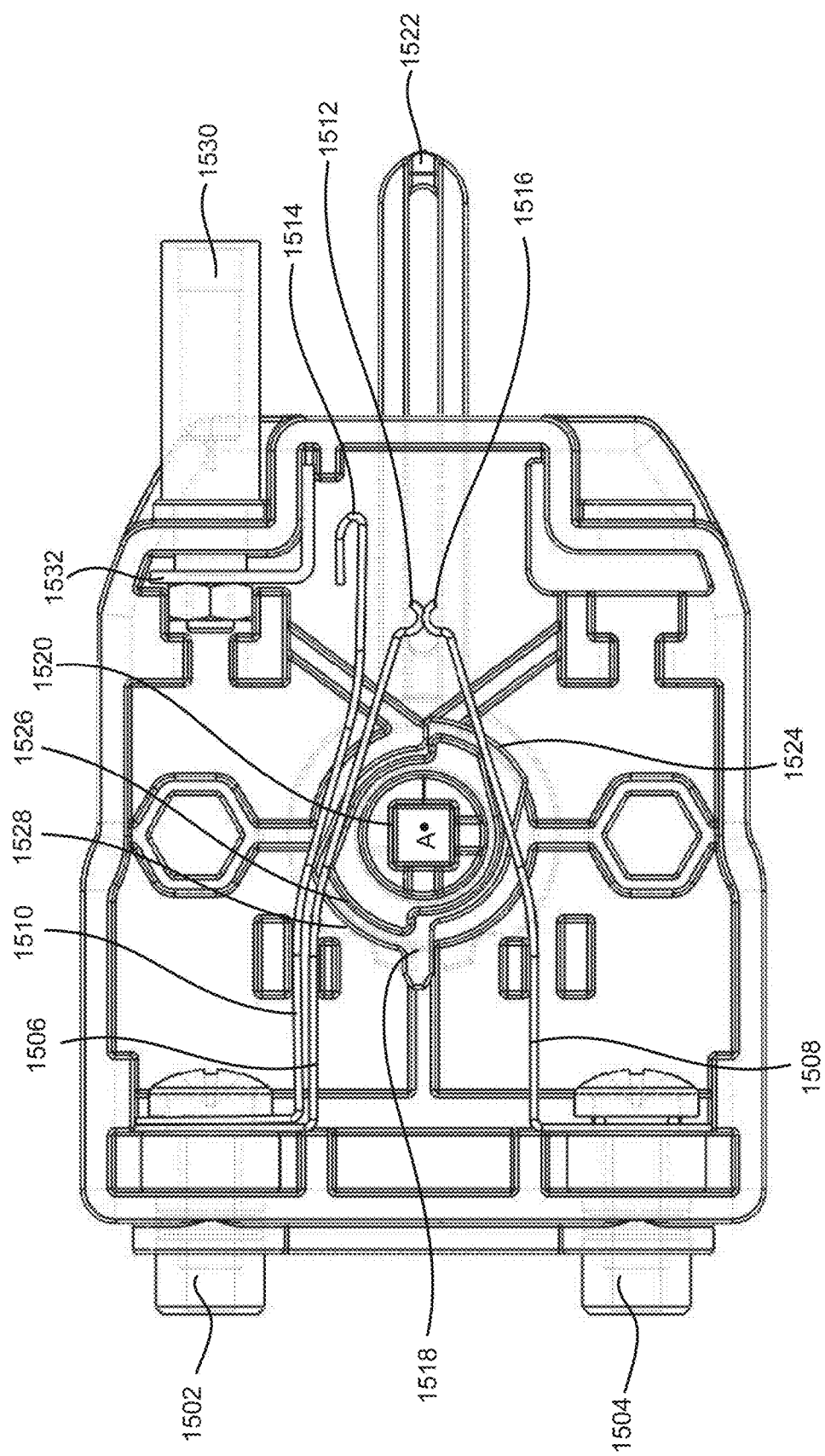
Figure 17:
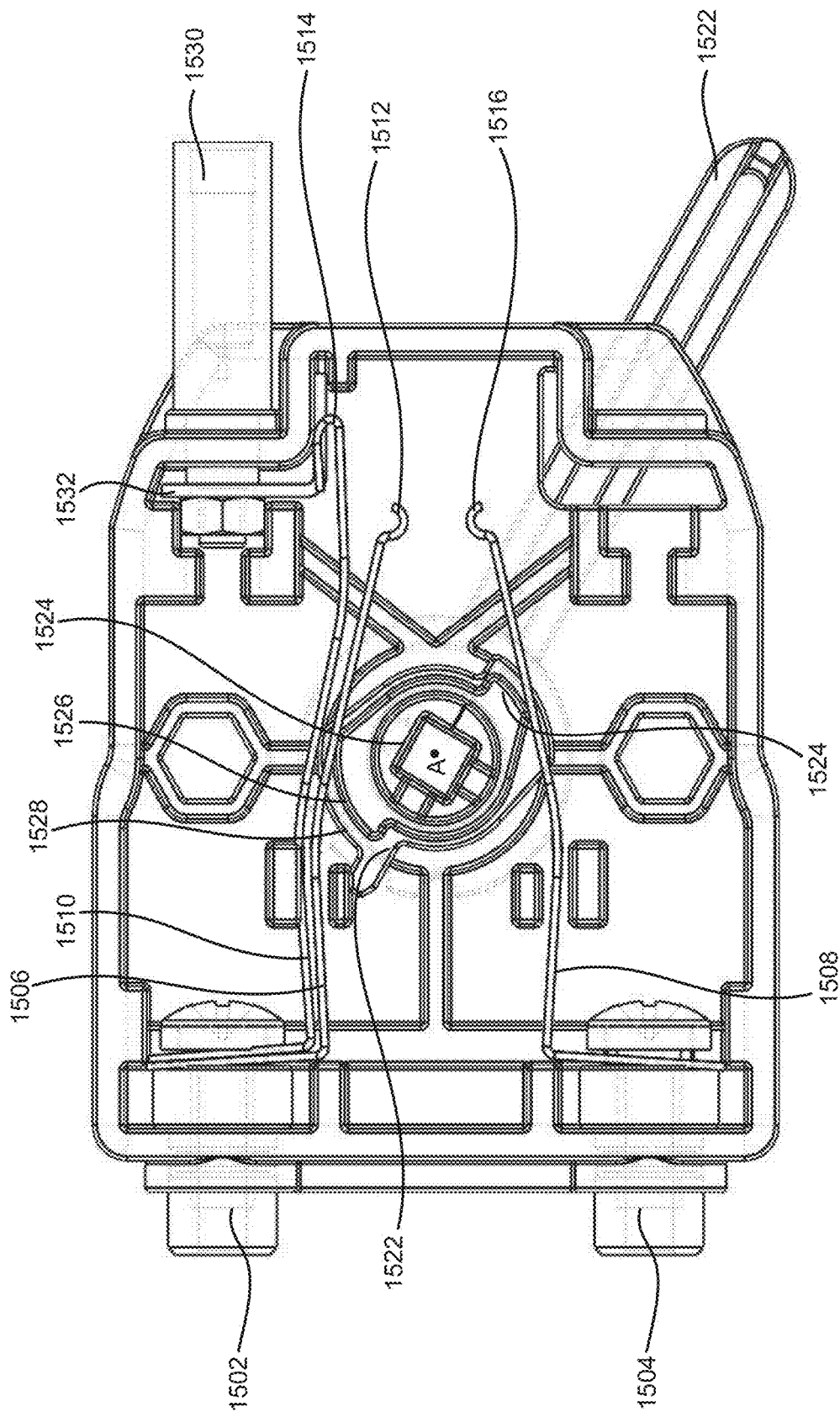

FIGS. 16-17 illustrates the example test switch unit 1500 in various stages of operation. Under normal operating conditions, the field supply current (interchangeably referred to as the "field current") generated from the appropriate generating components is provided to the field lead 1504. The field current passes through the field lead 1504 and through the second primary contact element 1508. Since the first end 1512 of the first primary contact element 1506 were previously in contact, with the end 1516 of the second primary contact element 1508 (as depicted in FIG. 15) and because the test signal lead 1530 is open, the field current travels through the pair of primary contact elements 1506, 1508, to the relay lead 1502 and eventually through the trip circuit which may be coupled to relay lead 1502.

For isolating the IED for testing, the lever 1522 is moved downwards direction B, as depicted in FIGS. 16-17. The movement of the lever 1522 affects the rotation of the shaft 1520, which in turn causes the rotation of the cam 1518. As the cam 1518 rotates, the inner profiled elements 1524, 1526 moves and pushes against the primary contact elements 1506, 1508. As the opposing inner profiled elements 1524, 1526 pushes against the primary contact elements 1506, 1508, the primary contact elements 1506, 1508 are pushed apart thereby breaking the contact between them (FIG. 16).

As the lever 1522 is further pushed in the downward direction, the cam 1518 rotates further such that the outer profiled element 1528 moves towards the secondary contact element 1510 and may subsequently push against the secondary contact element 1510 thereby resulting in the secondary contact element 1510 to move towards and eventually contacts the conducting element 1532 (FIG. 17). At this stage, field lead 1504 and the conducting element 1532 (and hence in turn the test signal lead 1530) are connected to each other through the secondary contact element 1510.

Although implementations of present subject matter have been described in language specific to structural features and/or methods, it is to be noted that the present subject matter is not necessarily limited to the specific features or methods described. Rather, the specific features and methods are disclosed and explained in the context of a few implementations for the present subject matter.

The invention claimed is:

1. A test system for an intelligent electronic device installed in an electric substation, wherein the test system comprises:
   a shaft;
   a lever coupled to the shaft;
   a first test switch unit coupled to a trip circuit, wherein the first test switch unit comprises:
      a first relay lead adapted to be communicatively coupled to the intelligent electronic device and the trip circuit;
      a first field lead operable to receive an input current;
      a first test signal lead;
      a first conducting element, wherein the first conducting element electrically couples the first relay lead to the first test signal lead;
      a trip contact element, having two ends, where one end of the trip contact element is connected to the first field lead, and the other end of the trip contact element is configured to abut against the first conducting element to complete an electrical path between the first field lead and the first relay lead; and
      a first cam mounted on the shaft and adapted to rotate about its axis and to engage with the trip contact element to decouple the other end of the trip contact element from the first conducting element;
   a second test switch unit coupled to a current transformer (CT) circuit, wherein the second test switch unit comprises:
      a second relay lead adapted to be communicatively coupled to the intelligent electronic device and the CT circuit;
      a second field lead for receiving an input field current;
      a second test signal lead;
      a second connecter port with a short-circuit element connected to the second connector port;

a second conducting element wherein the second conducting element electrically couples the second relay lead to the second test signal lead;

a primary contact element, having two ends, wherein one end of the primary contact element is connected to the second field lead, and the other end of the primary contact element is configured to abut against the second conducting element thereby completing an electrical path from the second field lead to the second relay lead;

a secondary contact element, having two ends, wherein one end of the secondary contact element is connected to the second field lead, and the other end of the secondary contact element extends away from the second field lead, and further wherein the secondary contact element is not in contact with the connector port; and a second cam mounted on the shaft and adapted to rotate about its axis, comprising a leading profiled element and a trailing profiled element, wherein the leading profiled element and the trailing profiled element are leading and trailing with regard to the rotation direction of the second cam, respectively, and wherein the leading profiled element is configured to engage with the secondary contact element to allow an end of the secondary contact element to come into contact with the short-circuit element and the trailing profiled element is configured to engage with the primary contact element to decouple the other end of the primary contact element from the second conducting element;

a third test switch unit coupled to a voltage transformer (VT) circuit, wherein the third test switch unit comprises:

a third relay lead adapted to be communicatively coupled to the intelligent electronic device and the VT circuit;

a third field lead for receiving an input current;

a third test signal lead;

a third conducting element wherein the third conducting element electrically couples the third relay lead to the third test signal lead;

a VT contact element, having two ends, where one end of the VT contact element is connected to the third field lead, and the other end of the VT contact element is configured to abut against the third conducting element to complete an electrical path between the third field lead and the third relay lead; and a third cam mounted on the shaft and adapted to rotate about its axis and engage with the VT contact element to decouple the other end of the VT contact element from the third conducting element.

2. The test system as claimed in claim 1, wherein the axis of the cams coincides with the axis of the shaft.

3. The test system as claimed in claim 1, wherein the shaft extends through the first test switch unit, the second test switch unit and the third test switch unit such that the movement of the shaft affects rotation of the cams in the first test switch unit, second test switch unit and the third test switch unit.

4. The test system as claimed in claim 1, wherein the test system is configured to test the intelligent electronic device upon the trip circuit being opened by the first test switch unit, the current transformer (CT) circuit being shorted by the second test switch unit, and the voltage transformer (VT) circuit being isolated by the third test switch unit.

5. The test system as claimed in claim 1, wherein the lever is moveable in a plane orthogonal to the axis of the shaft.

6. The test system as claimed in claim 1, wherein the first conducting element comprises a second secondary contact element and a second conducting element, with the second secondary contact element manufactured from an electrically conducting and flexible material having one end connected with the first relay lead and another end being moveable, and wherein the other end of the second secondary contact element is moveable in response to the rotation of the first cam and is to come into contact with the second conducting element.

7. The test system as claimed in claim 1, wherein the second conducting element further comprises:

a second primary contact element having one end connected with the first relay lead and a moveable end;

a third secondary contact element having one end connected with the first relay lead and another moveable end; and a fourth conducting element;

wherein in response to the rotation of the first cam:
the moveable end of the second primary contact element being initially in contact with the fourth conducting element, is configured to disengage and move away from the fourth conducting element; and
the other moveable end is configured to come into contact with the fourth conducting element.

8. The test system as claimed in claim 7, wherein the first cam further comprises additional profiled elements which are configured to move the second primary contact element and the third secondary contact element.

9. The test system as claimed in claim 1, wherein the third conducting element comprises a fourth secondary contact element and a fourth conducting element, with the fourth secondary contact element manufactured from an electrically conducting and flexible material having one end connected with the third relay lead and another end being moveable, and wherein the other end of the fourth secondary contact element is moveable in response to the rotation of the third cam to come into contact with the fourth conducting element.

10. A method for operating the test system as claimed in claim 1, wherein the method comprises:

engaging the lever to rotate the cams about the axis with the lever being coupled to the cams, wherein rotation of the cams leads to:
open the trip circuit coupled to the first test switch unit when the first cam engages with the first trip contact element;
short the CT circuit coupled to the second test switch unit when the leading profiled element of the second cam engages with the secondary contact element and the trailing profiled element of the second cam engages with the primary contact element; and
isolate the VT circuit coupled to the third test switch unit when the third cam engages with the VT contact element.

11. A test system for an intelligent electronic device installed in an electric substation, wherein the test system comprises:

a shaft;

a lever coupled to the shaft;

a first test switch unit coupled to a trip circuit, wherein the first test switch unit-comprises:

a first relay lead adapted to be communicatively coupled to the intelligent electronic device and the trip circuit;

a first field lead operable to receive an input current;

a first test signal lead;

a first conducting element, wherein the first conducting element electrically couples the first relay lead to the first test signal lead;

a trip contact element, having two ends, where one end of the trip contact element is connected to the first field lead, and the other end of the trip contact element is configured to abut against the first conducting element to complete an electrical path between the first field lead and the first relay lead; and a first cam mounted on the shaft and adapted to rotate about its axis and to engage with the trip contact element to decouple the other end of the trip contact element from the first conducting element; and a second test switch unit coupled to a current transformer (CT) circuit, wherein the second test switch unit comprises:

a second relay lead adapted to be communicatively coupled to the intelligent electronic device and the CT circuit;

a second field lead for receiving an input field current;

a second test signal lead;

a second connecter port with a short-circuit element connected to the second connector port;

a second conducting element wherein the second conducting element electrically couples the second relay lead to the second test signal lead;

a primary contact element, having two ends, wherein one end of the primary contact element is connected to the second field lead, and the other end of the primary contact element is configured to abut against the second conducting element thereby completing an electrical path from the second field lead to the second relay lead;

a secondary contact element, having two ends, wherein one end of the secondary contact element is connected to the second field lead, and the other end of the secondary contact element extends away from the second field lead, and further wherein the secondary contact element is not in contact with the connector port; and a second cam mounted on the shaft and adapted to rotate about its axis, comprising a leading profiled element and a trailing profiled element, wherein the leading profiled element and the trailing profiled element are leading and trailing with regard to the rotation direction of the second cam, respectively, and wherein the leading profiled element is configured to engage with the secondary contact element to allow an end of the secondary contact element to come into contact with the short-circuit element and the trailing profiled element is configured to engage with the primary contact element to decouple the other end of the primary contact element from the second conducting element.

12. The test system as claimed in claim 11, wherein the axis of the cams coincides with the axis of the shaft.

13. The test system as claimed in claim 11, wherein the shaft extends through the first test switch unit and the second test switch unit such that the movement of the shaft affects rotation of the cams in the first test switch unit and the second test switch unit.

14. The test system as claimed in claim 11, wherein the test system is configured to test the intelligent electronic device upon the trip circuit being opened by the first test switch unit and the current transformer (CT) circuit being shorted by the second test switch unit.

15. The test system as claimed in claim 11, wherein the lever is moveable in a plane orthogonal to the axis of the shaft.

16. The test system as claimed in claim 11, wherein the first conducting element comprises a second secondary contact element and a second conducting element, with the second secondary contact element manufactured from an electrically conducting and flexible material having one end connected with the first relay lead and another end being moveable, and wherein the other end of the second secondary contact element is moveable in response to the rotation of the first cam and is to come into contact with the second conducting element.

17. The test system as claimed in claim 11, wherein the second conducting element further comprises:

a second primary contact element having one end connected with the first relay lead-and a moveable end;

a third secondary contact element having one end connected with the first relay lead-and another moveable end; and a third conducting element;

wherein in response to the rotation of the first cam:

the moveable end of the second primary contact element being initially in contact with the third conducting element, is configured to disengage and move away from the third conducting element; and the other moveable end is configured to come into contact with the third conducting element.

18. A test system for an intelligent electronic device installed in an electric substation, wherein the test system comprises:

a shaft;

a lever coupled to the shaft;

a first test switch unit coupled to a trip circuit, wherein the first test switch unit-comprises:

a first relay lead adapted to be communicatively coupled to the intelligent electronic device and the trip circuit;

a first field lead operable to receive an input current;

a first test signal lead;

a first conducting element, wherein the first conducting element electrically couples the first relay lead to the first test signal lead;

a trip contact element, having two ends, where one end of the trip contact element is connected to the first field lead, and the other end of the trip contact element is configured to abut against the first conducting element to complete an electrical path between the first field lead and the first relay lead; and a first cam mounted on the shaft and adapted to rotate about its axis and to engage with the trip contact element to decouple the other end of the trip contact element from the first conducting element; and a second test switch unit coupled to a voltage transformer (VT) circuit, wherein the second test switch unit comprises:

a second relay lead adapted to be communicatively coupled to the intelligent electronic device and the VT circuit;

a second field lead for receiving an input current;

a second test signal lead;

a second conducting element wherein the second conducting element electrically couples the second relay lead to the second test signal lead;

a VT contact element, having two ends, where one end of the VT contact element is connected to the second field lead, and the other end of the VT contact element is configured to abut against the second conducting element to complete an electrical path between the second field lead and the second relay lead; and a second cam mounted on the shaft and adapted to rotate about its axis and engage with the VT contact element to decouple the other end of the VT contact element from the second conducting element.

19. The test system as claimed in claim 18, wherein the test system is configured to test the intelligent electronic device upon the trip circuit being opened by the first test switch unit and the voltage transformer (VT) circuit being isolated by the second test switch unit.

20. The test system as claimed in claim 18, wherein the second conducting element comprises a secondary contact element and a third conducting element, with the secondary contact element manufactured from an electrically conducting and flexible material having one end connected with the second relay lead and another end being moveable, and wherein the other end of the secondary contact element is moveable in response to the rotation of the second cam to come into contact with the third conducting element.

* * * * *